United States Patent
Lin et al.

(10) Patent No.: US 11,476,347 B2
(45) Date of Patent: Oct. 18, 2022

(54) PROCESSES FOR REMOVING SPIKES FROM GATES

(71) Applicant: Taiwan Semiconductor Manufacturing Co., Ltd., Hsinchu (TW)

(72) Inventors: Shih-Yao Lin, New Taipei (TW); Kuei-Yu Kao, Hsinchu (TW); Chen-Ping Chen, Toucheng Township (TW); Chih-Han Lin, Hsinchu (TW); Ming-Ching Chang, Hsinchu (TW); Chao-Cheng Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/018,793

(22) Filed: Sep. 11, 2020

(65) Prior Publication Data

US 2021/0367058 A1 Nov. 25, 2021

Related U.S. Application Data

(60) Provisional application No. 63/027,398, filed on May 20, 2020.

(51) Int. Cl.
| | |
|---|---|
| *H01L 29/40* | (2006.01) |
| *H01L 29/66* | (2006.01) |
| *H01L 29/78* | (2006.01) |
| *H01L 21/3213* | (2006.01) |
| *H01L 21/311* | (2006.01) |

(52) U.S. Cl.
CPC ...... *H01L 29/6656* (2013.01); *H01L 29/6653* (2013.01); *H01L 29/66545* (2013.01); *H01L 29/66795* (2013.01); *H01L 29/785* (2013.01); *H01L 21/31116* (2013.01); *H01L 21/32134* (2013.01); *H01L 21/32137* (2013.01)

(58) Field of Classification Search
None
See application file for complete search history.

(56) References Cited

U.S. PATENT DOCUMENTS

| | | | |
|---|---|---|---|
| 7,947,589 B2 | 5/2011 | Muralidhar et al. | |
| 8,637,359 B2 | 1/2014 | Chang et al. | |
| 9,281,378 B2 | 3/2016 | Ching et al. | |
| 10,497,809 B2 | 12/2019 | Zhu | |
| 10,879,180 B2 * | 12/2020 | Zang | H01L 29/66795 |
| 11,024,550 B2 | 6/2021 | Liao et al. | |
| 11,152,267 B2 | 10/2021 | Perng et al. | |

(Continued)

FOREIGN PATENT DOCUMENTS

| | | |
|---|---|---|
| KR | 20180060952 A | 6/2018 |
| TW | 201916156 A | 4/2019 |

(Continued)

*Primary Examiner* — Ali Naraghi
(74) *Attorney, Agent, or Firm* — Slater Matsil, LLP

(57) ABSTRACT

A method includes forming a dummy gate electrode on a semiconductor region, forming a first gate spacer on a sidewall of the dummy gate electrode, and removing an upper portion of the first gate spacer to form a recess, wherein a lower portion of the first gate spacer remains, filling the recess with a second gate spacer, removing the dummy gate electrode to form a trench, and forming a replacement gate electrode in the trench.

20 Claims, 23 Drawing Sheets

(56) References Cited

U.S. PATENT DOCUMENTS

| | | |
|---|---|---|
| 2009/0206406 A1 | 8/2009 | Rachmady et al. |
| 2011/0198673 A1 | 8/2011 | Bonser et al. |
| 2014/0124841 A1 | 5/2014 | Xie et al. |
| 2018/0174904 A1 | 6/2018 | Hsieh et al. |
| 2018/0219079 A1 | 8/2018 | Xie et al. |
| 2018/0277430 A1 | 9/2018 | Xie et al. |
| 2018/0331219 A1* | 11/2018 | Liou .................. H01L 29/7843 |
| 2020/0035808 A1* | 1/2020 | Bao ..................... H01L 29/165 |
| 2020/0075420 A1* | 3/2020 | Chen .................. H01L 29/6656 |

FOREIGN PATENT DOCUMENTS

| | | |
|---|---|---|
| TW | 202016999 A | 5/2020 |
| WO | 2017156913 A1 | 9/2017 |

\* cited by examiner

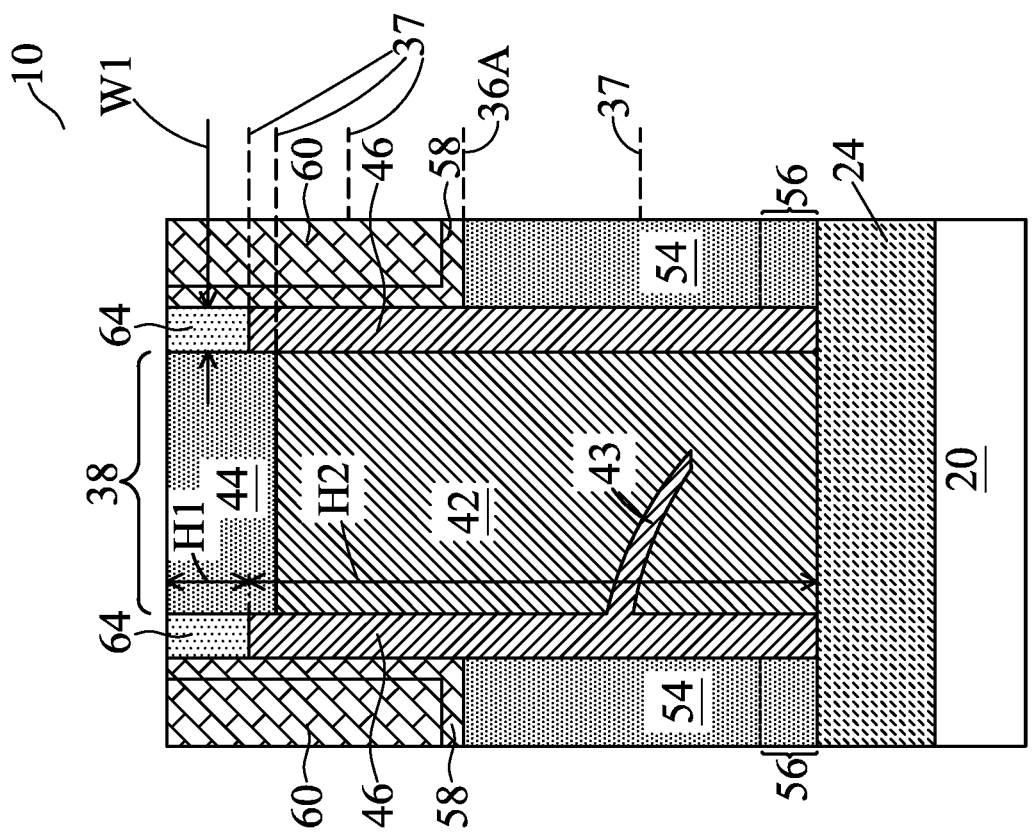
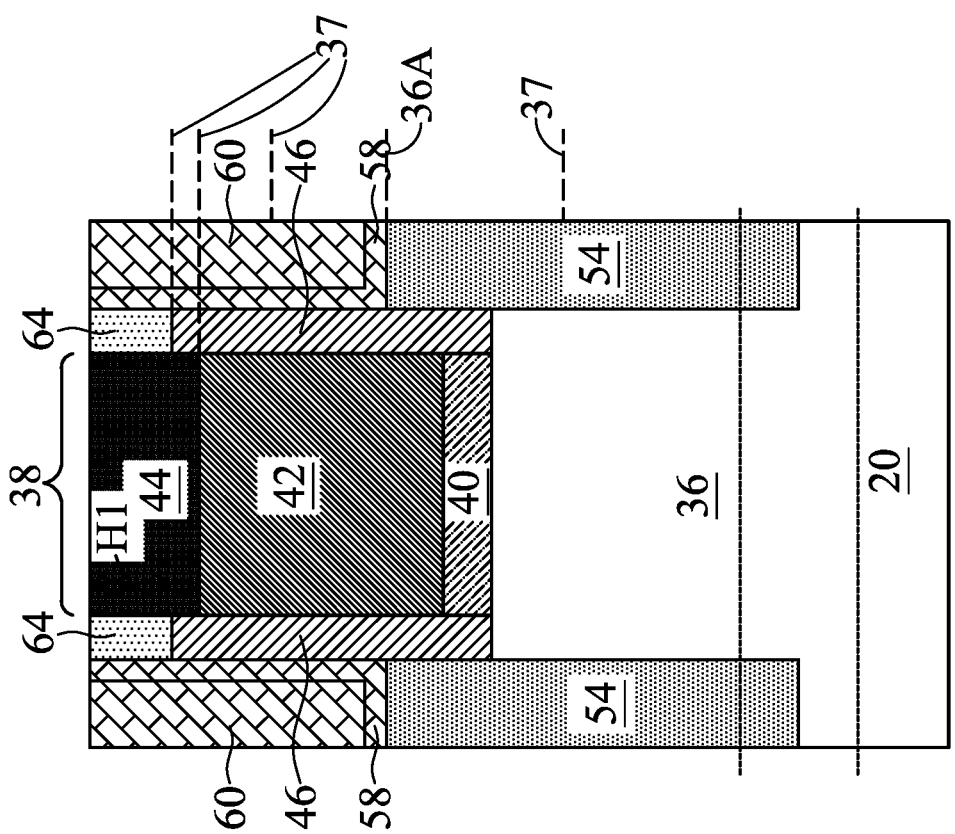
FIG. 9B
FIG. 9A

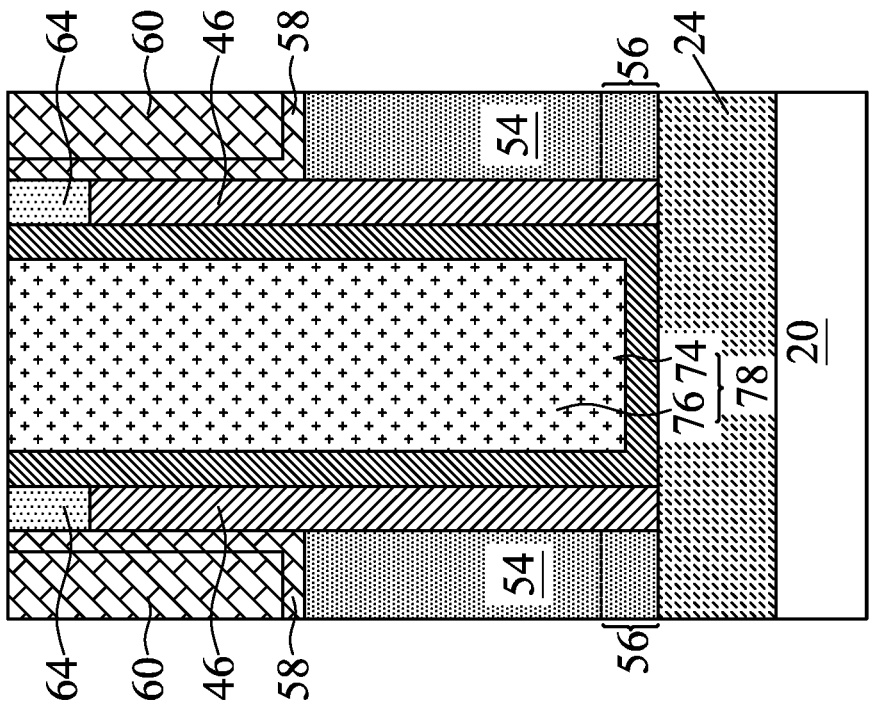
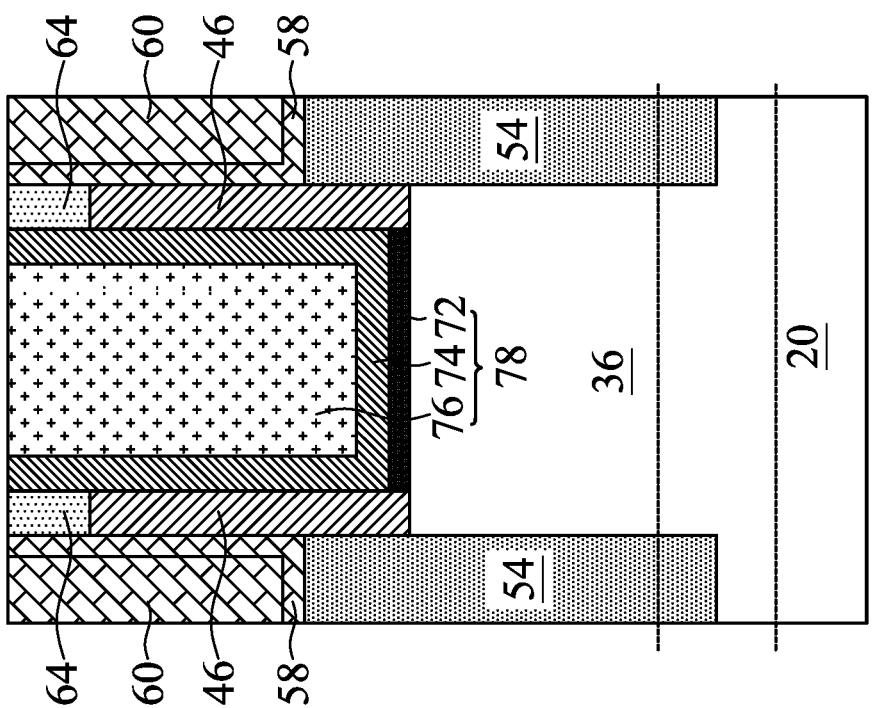
FIG. 13A
FIG. 13B

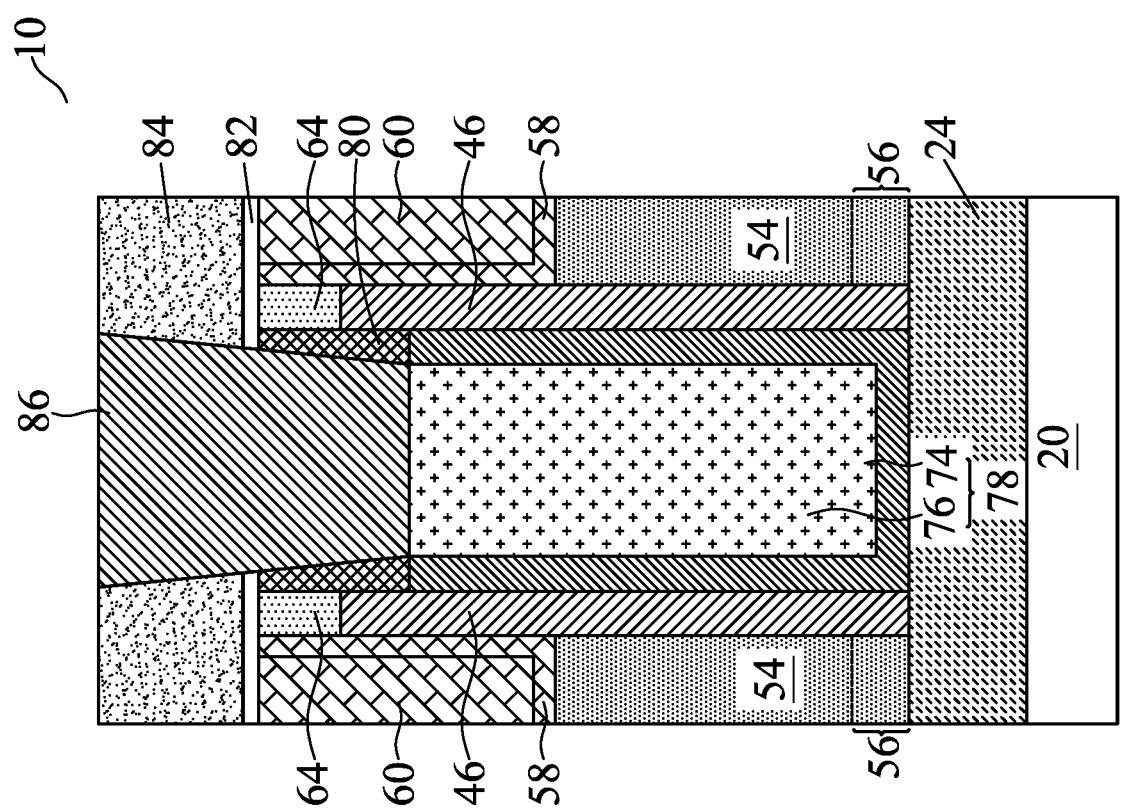
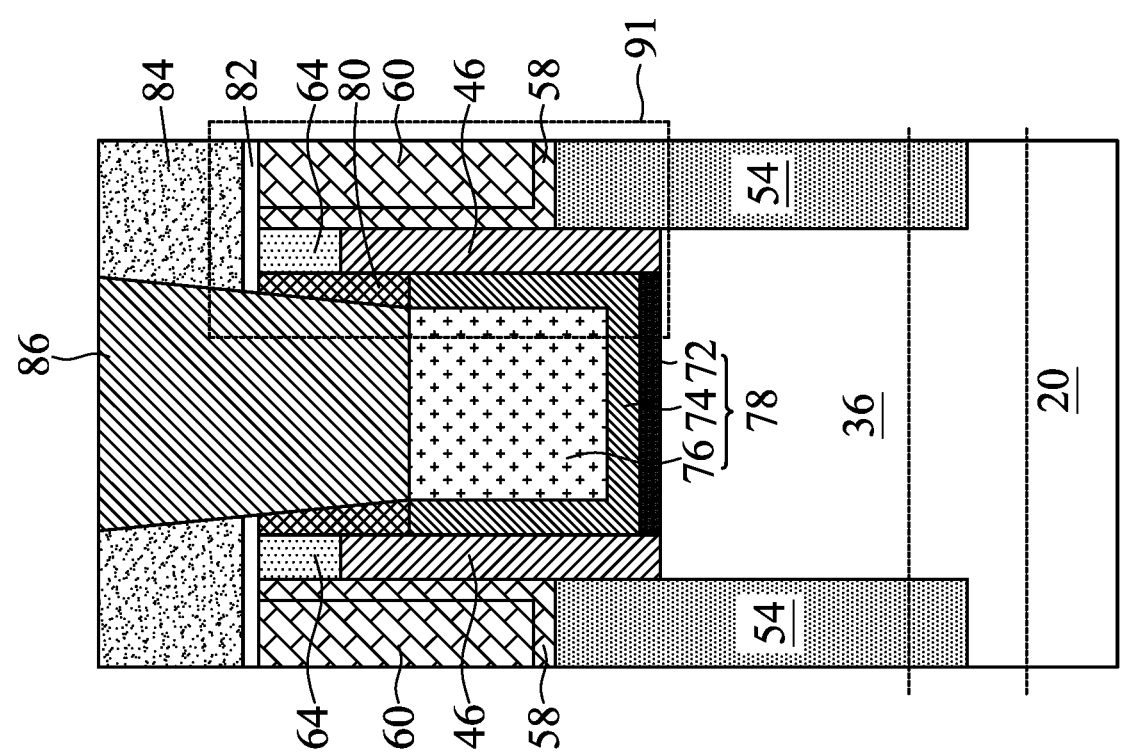
FIG. 14A
FIG. 14B

PROCESSES FOR REMOVING SPIKES FROM GATES

PRIORITY CLAIM AND CROSS-REFERENCE

This application claims the benefit of the following provisionally filed U.S. patent application: Application No. 63/027,398, filed on May 20, 2020, and entitled "Dummy Gate Replacement with Spacer Replacement Approach;" which application is hereby incorporated herein by reference.

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be generated at the surface of the semiconductor.

Metal gates may include a plurality of layers, so that the different requirements of NMOS devices and PMOS devices can be met. The formation of metal gates typically involves removing dummy gate stacks to form trenches, depositing a plurality of metal layers extending into the trenches, forming metal regions to fill the remaining portions of the trenches, and then performing a Chemical Mechanical Polish (CMP) process to remove excess portions of the metal layers. The remaining portions of the metal layers and metal regions form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6, 7A, 7B, 7C, 8A, 8B, 9A, 9B, 10A, 10B, 10C, 11A, 11B, 11C, 12A, 12B, 13A, 13B, 14A, 14B, and 15 illustrate the perspective views and cross-sectional views of intermediate stages in the formation of a transistor in accordance with some embodiments.

DETAILED DESCRIPTION

Figure 1:
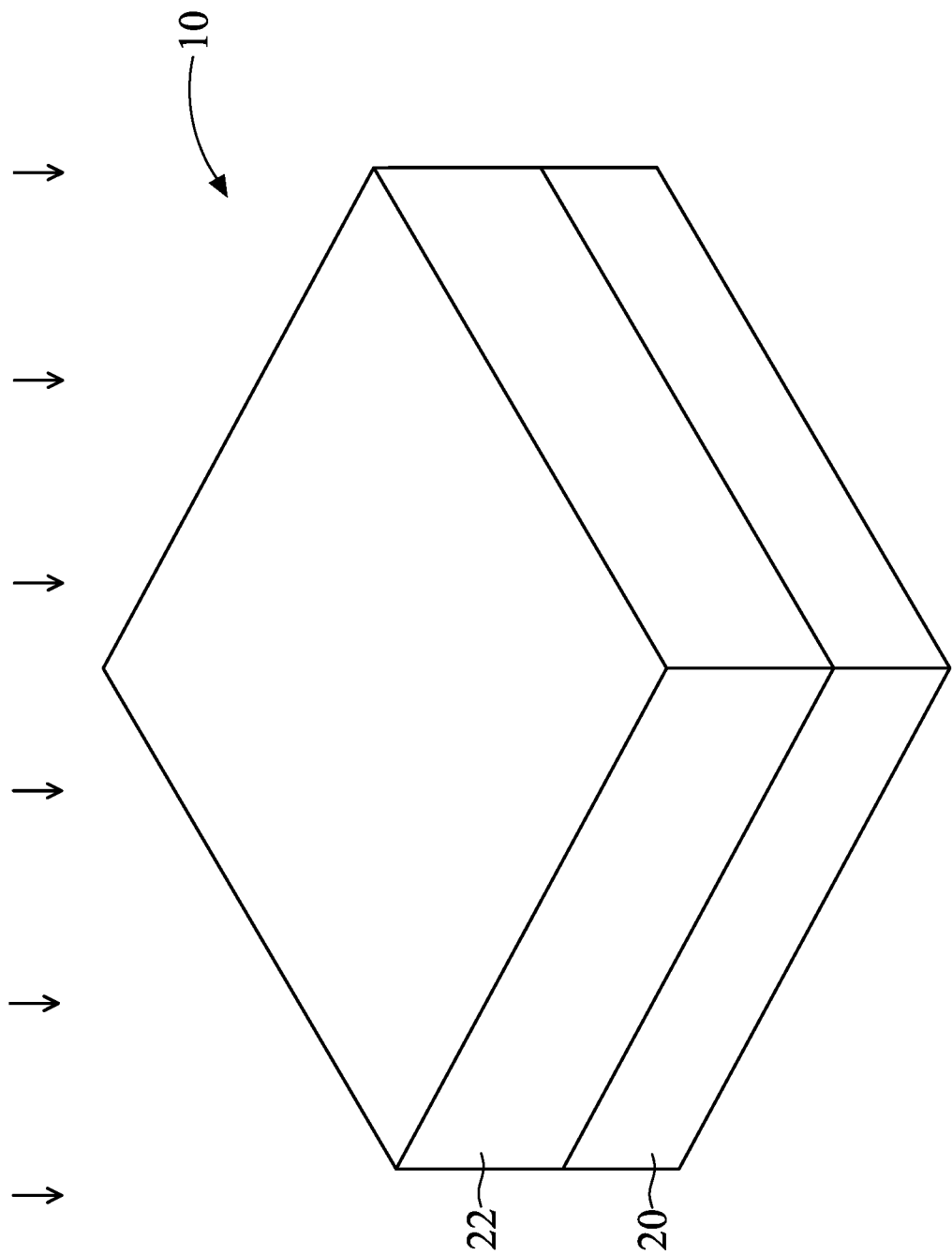

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor and the method of removing spacer spikes in dummy gate stacks are provided in accordance with some embodiments. Dummy gate electrodes may have voids formed in portions of the dummy gate electrodes that extend between neighboring protruding fins. In the subsequent formation of gate spacers, the material of the gate spacers may be filled into the voids to form spacer spikes. In accordance with some embodiments, the top portions of gate spacers are removed and replaced with replacement gate spacers, which are formed of a material different from the material of the underlying portions of the original gate spacers. Accordingly, through an anisotropic etching process, the spacer spikes may be etched, during which replacement gate spacers may act as an etching mask. Through the replacement of the top portions of the gate spacers, the gate spacers are not adversely etched in the removal of the spacer spikes. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 24:
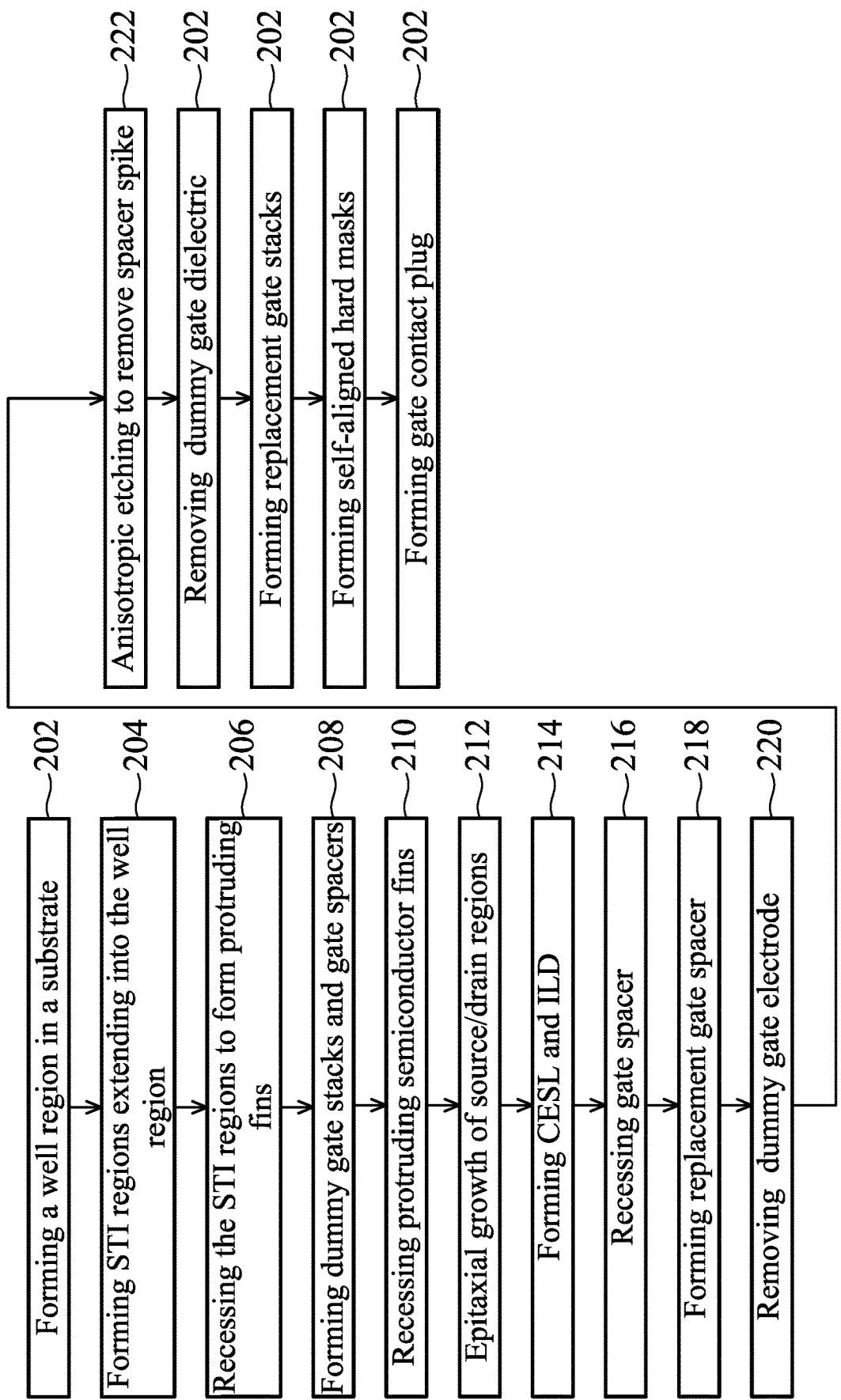
FIG. 24 illustrates a process flow for forming a transistor in accordance with some embodiments.

FIGS. 1-6, 7A, 7B, 7C, 8A, 8B, 9A, 9B, 10A, 10B, 10C, 11A, 11B, 11C, 12A, 12B, 13A, 13B, 14A, 14B, and 15 illustrate the perspective views and cross-sectional views of intermediate stages in the formation of a transistor including replacement gate spacers in accordance with some embodiments of the present disclosure. The corresponding processes are also reflected schematically in the process flow shown in FIG. 24.

Figure 3:
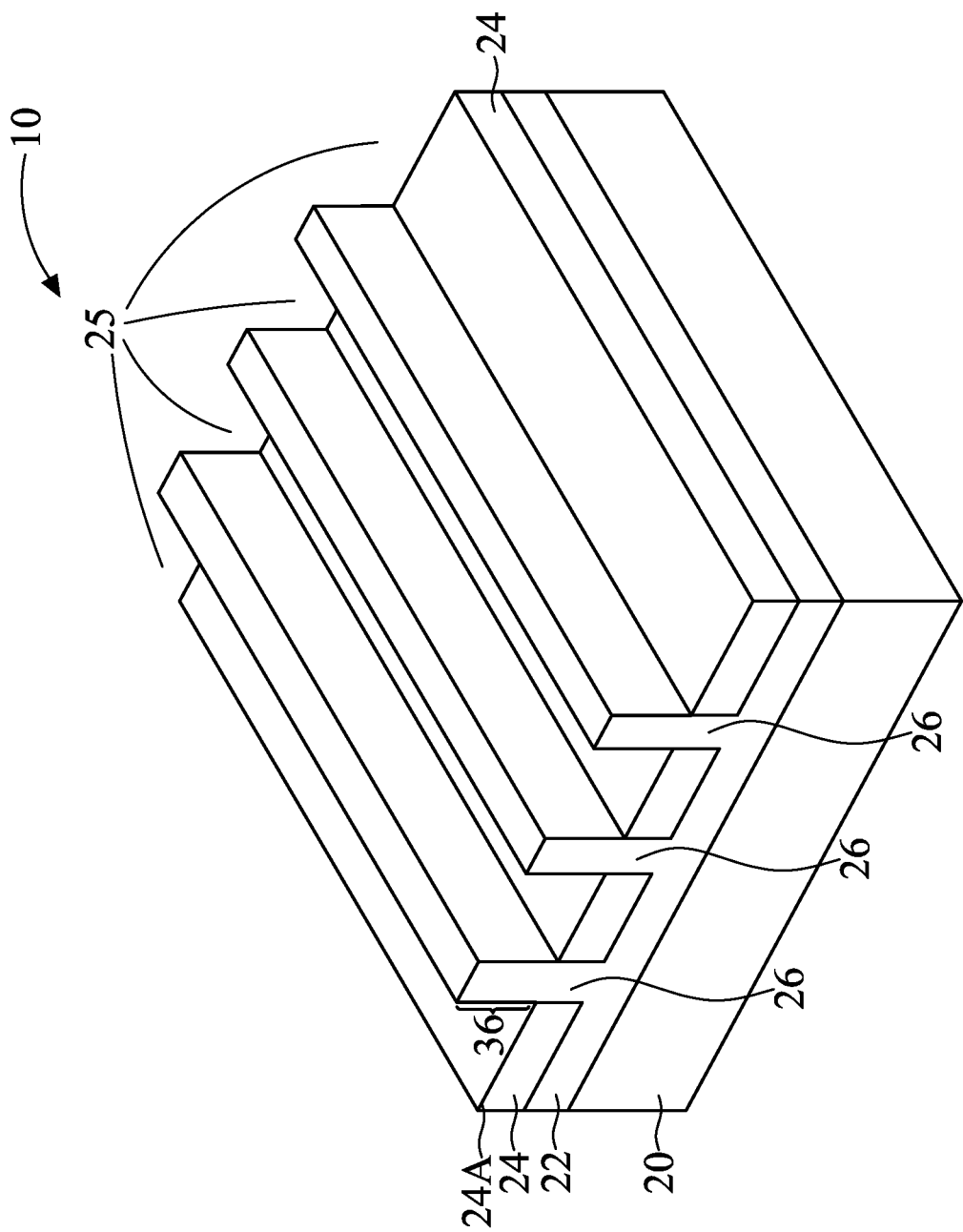

The formation of dummy gate stacks 38 may include forming a dummy gate dielectric layer (FIG. 7B) on protruding fins 36, and depositing a dummy gate electrode layer and a hard mask layer(s) on the dummy gate electrode layer. The dummy gate dielectric layer may be formed, for example, through thermal oxidation, chemical oxidation, or the like, so that a top surface layer of each of protruding fins 36 is oxidized to form the corresponding gate dielectric. The dummy gate electrode layer may be formed of polysilicon, amorphous silicon, or the like, and may be formed through a deposition process. The hard mask layer may be formed of silicon nitride, silicon oxide, silicon carbo-nitride, or multilayers thereof. The deposition processes may be performed using Atomic Layer Deposition, Chemical Vapor Deposition (CVD), Plasma Enhanced Chemical Vapor Deposition (PECVD), or the like. In accordance with some embodiments, as shown in FIG. 3, the trenches 25 between neighboring protruding fins 36 have high aspect ratios (the ratios of heights to the corresponding widths). Accordingly, it is difficult to fill the dummy gate electrode layer into the trenches 25, and voids (which may be in the form of seams) may be formed in the dummy gate electrode layer.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 24. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
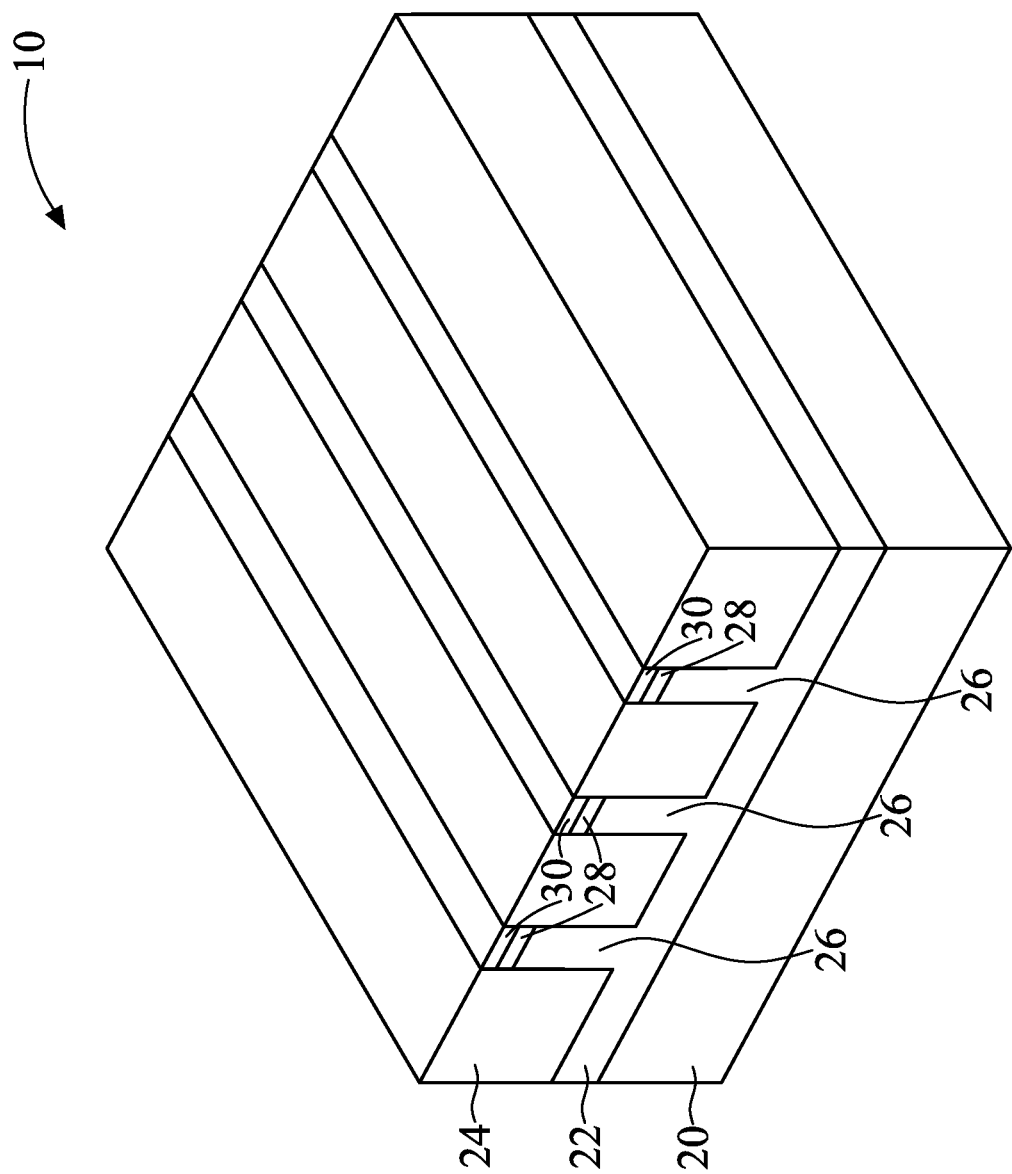

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 shown in FIG. 24. The portions of substrate 20 between neighboring STI regions 24 are referred to as semiconductor strips 26. To form STI regions 24, pad oxide layer 28 and hard mask layer 30 may be formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed using Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through the thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), Chemical Vapor Deposition (CVD), or the like. STI regions 24 also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard mask layers 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Referring to FIG. 3, STI regions 24 are recessed, so that the top portions of semiconductor strips 26 protrude higher than the top surfaces 24A of the remaining portions of STI regions 24 to form protruding fins 36. Trenches 25 are located between protruding fins 36. The respective process is illustrated as process 206 in the process flow 200 shown in FIG. 24. The etching may be performed using a dry etching process, wherein the mixture of HF$_3$ and NH$_3$, for example, is used as an etching gas. During the etching process, plasma may be generated. Argon may also be included. In accordance with alternative embodiments of the present disclosure, the recessing of STI regions 24 is performed using a wet etching process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
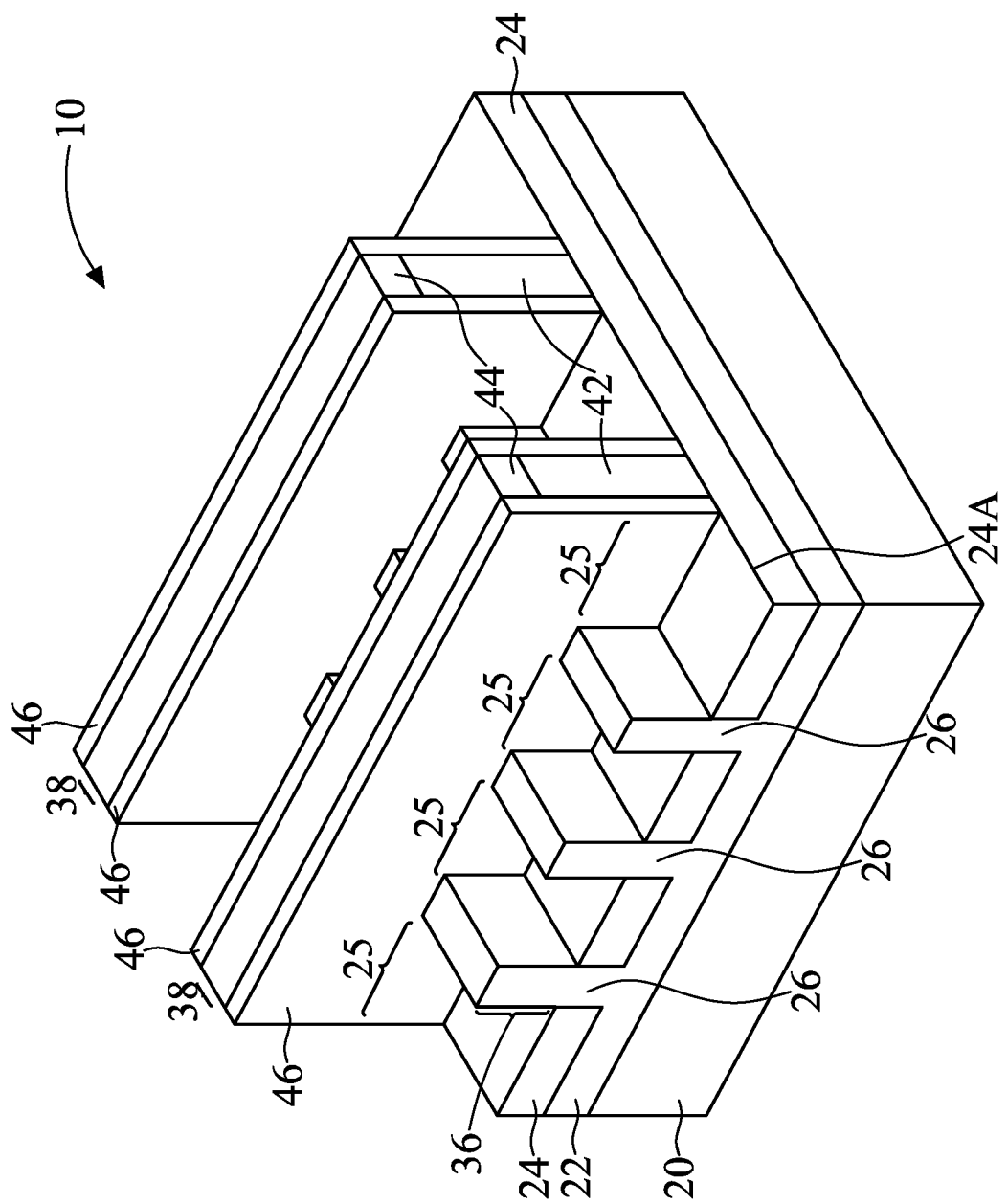

Referring to FIG. 4, dummy gate stacks 38 are formed to extend on the top surfaces and the sidewalls of (protruding) fins 36. The respective process is illustrated as process 208 in the process flow 200 shown in FIG. 24. Dummy gate stacks 38 may include dummy gate dielectrics 40 (FIG. 7B) and dummy gate electrodes 42 over dummy gate dielectrics 40. Each of dummy gate stacks 38 may also include one (or a plurality of) hard mask layer 44 over dummy gate electrodes 42. Dummy gate stacks 38 may cross over a single one or a plurality of protruding fins 36 and STI regions 24. Dummy gate stacks 38 also have lengthwise directions perpendicular to the lengthwise directions of protruding fins 36.

The formation of dummy gate stacks 38 may include forming dummy gate dielectrics 40 (FIG. 7B) on protruding fins 36, and depositing a dummy gate electrode and a hard mask layer(s) on the dummy gate electrode. The dummy gate dielectrics 40 may be formed, for example, through thermal oxidation, chemical oxidation, or the like, so that a top surface layer of each of protruding fins 36 is oxidized to form the corresponding gate dielectric. Dummy gate electrodes 42 may be formed of polysilicon, amorphous silicon, or the like, and may be formed through a deposition process. Hard mask layers 44 may be formed of silicon nitride, silicon oxide, silicon carbo-nitride, or multi-layers thereof. The deposition processes may be performed using Atomic Layer Deposition, Chemical Vapor Deposition (CVD), Plasma Enhanced Chemical Vapor Deposition (PECVD), or the like. In accordance with some embodiments, as shown in FIG. 3, the trenches 25 between neighboring protruding fins 36 have high aspect ratios (the ratios of heights to the corresponding widths). Accordingly, it is difficult to fill the dummy gate electrode layer into the trenches 25, and voids (which may be in the form of seams) may be formed in the dummy gate electrode layer.

After the formation of the dummy gate dielectric layer, the dummy gate electrode layer, and the hard mask layer, etching processes are performed to pattern the dummy gate dielectric layer, the dummy gate electrode layer, and the hard mask layer, resulting in the gate dielectrics 40 (FIG. 7B), dummy gate electrodes 42, and hard masks 44 as shown in FIG. 4. Some of the voids (filled by spacer spikes 43 in FIG. 7C) in the dummy gate electrode layer may be exposed as a result of the patterning process, and these voids extend from the sidewalls of dummy gate electrodes 42 into the corresponding dummy gate electrodes. Some of the voids may even penetrate through the dummy gate electrodes 42. A likely void may be perceived by referring to FIG. 7C, wherein a void is occupied by gate spike 43. When viewed in the top view of FIG. 4, the voids may be located in the middle of protruding fins 36, or in random positions. Furthermore, the voids are more likely to be formed inside trenches 25 due to the high aspect ratio of trenches 25, and are less likely to be formed in the locations higher than the top surfaces of protruding fins 36.

Next, gate spacers 46 are formed on the sidewalls of dummy gate stacks 38. The respective process is also shown as process 208 in the process flow 200 shown in FIG. 24. In accordance with some embodiments of the present disclosure, gate spacers 46 may have a single-layer structure or a multi-layer structure including a plurality of dielectric layers. The formation of gate spacers 46 may include depositing a blanket gate spacer layer (which may include a single layer or a plurality of sub layers with different materials). The gate spacers 46 are formed of a dielectric material(s), which may be a silicon-based dielectric material such as SiN, SiON, SiOCN, SiC, SiOC, $SiO_2$, or the like.

In the deposition of the blanket gate spacer layer, a conformal deposition process such as an ALD process or a CVD process may be used. Accordingly, the material of the blanket gate spacer layer extends into the voids in the dummy gate electrodes 42 to form spacer spikes, which is schematically illustrated in FIG. 7C as spacer spike 43. There may be one or a plurality of spacer spikes formed in each of trenches 25. Some of the spacer spikes 43 may be located in the middle of the corresponding trenches 25, and extends parallel to the lengthwise direction of protruding fins 36. Some of spacer spikes 43 may penetrate through the corresponding dummy gate electrode 42 and connect opposing gate spacers 46. The spacer spikes 43 are more likely to be formed between neighboring protruding fins 36 since the voids are more likely to be formed in trenches 25, and are less likely to be formed in locations higher than the top surfaces of protruding fins 36.

Figure 5:
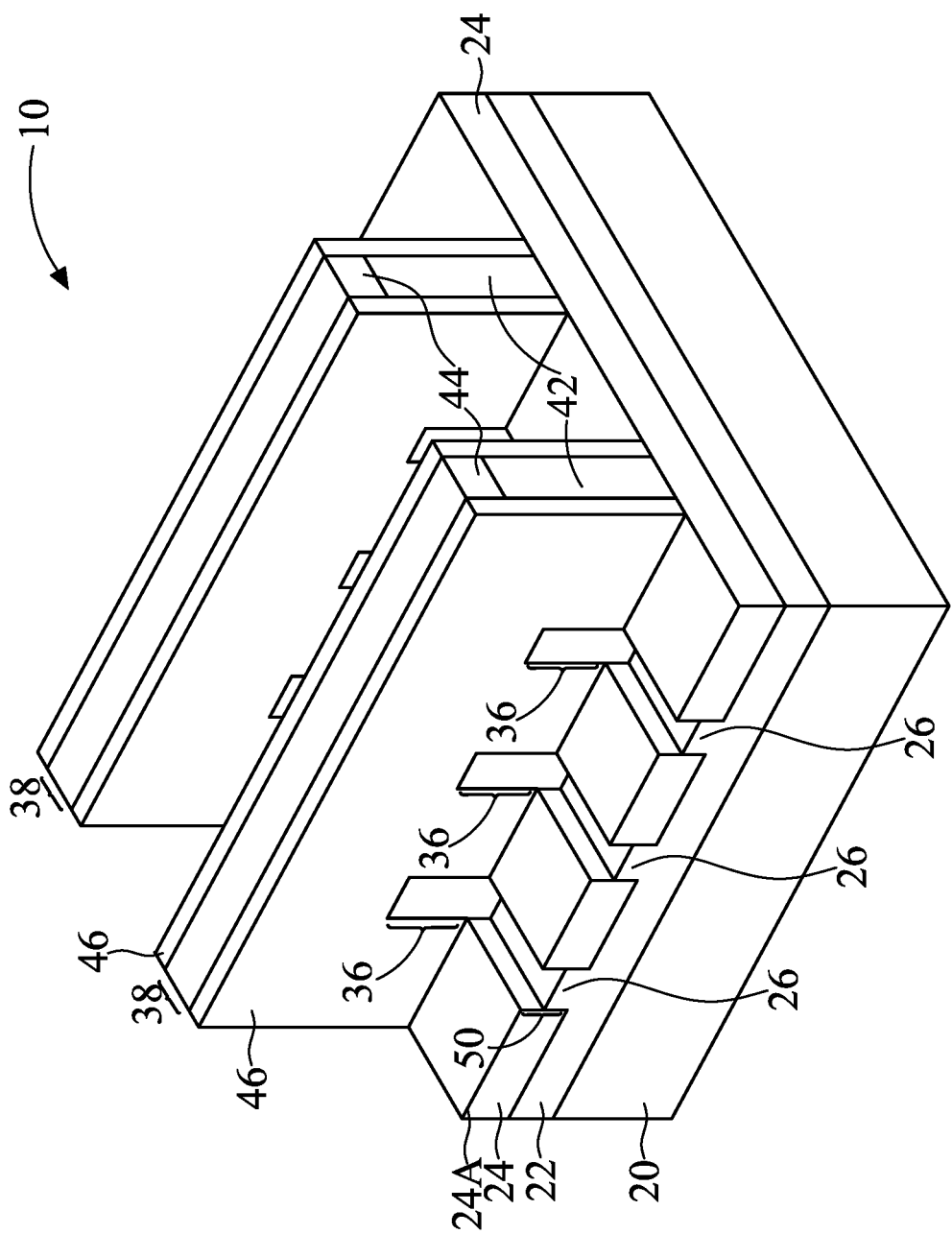

An etching process is then performed to etch the portions of protruding fins 36 that are not covered by dummy gate stacks 38 and gate spacers 46, resulting in the structure shown in FIG. 5. The respective process is illustrated as process 210 in the process flow 200 shown in FIG. 24. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between the remaining portions of protruding fins 36.

Figure 6:
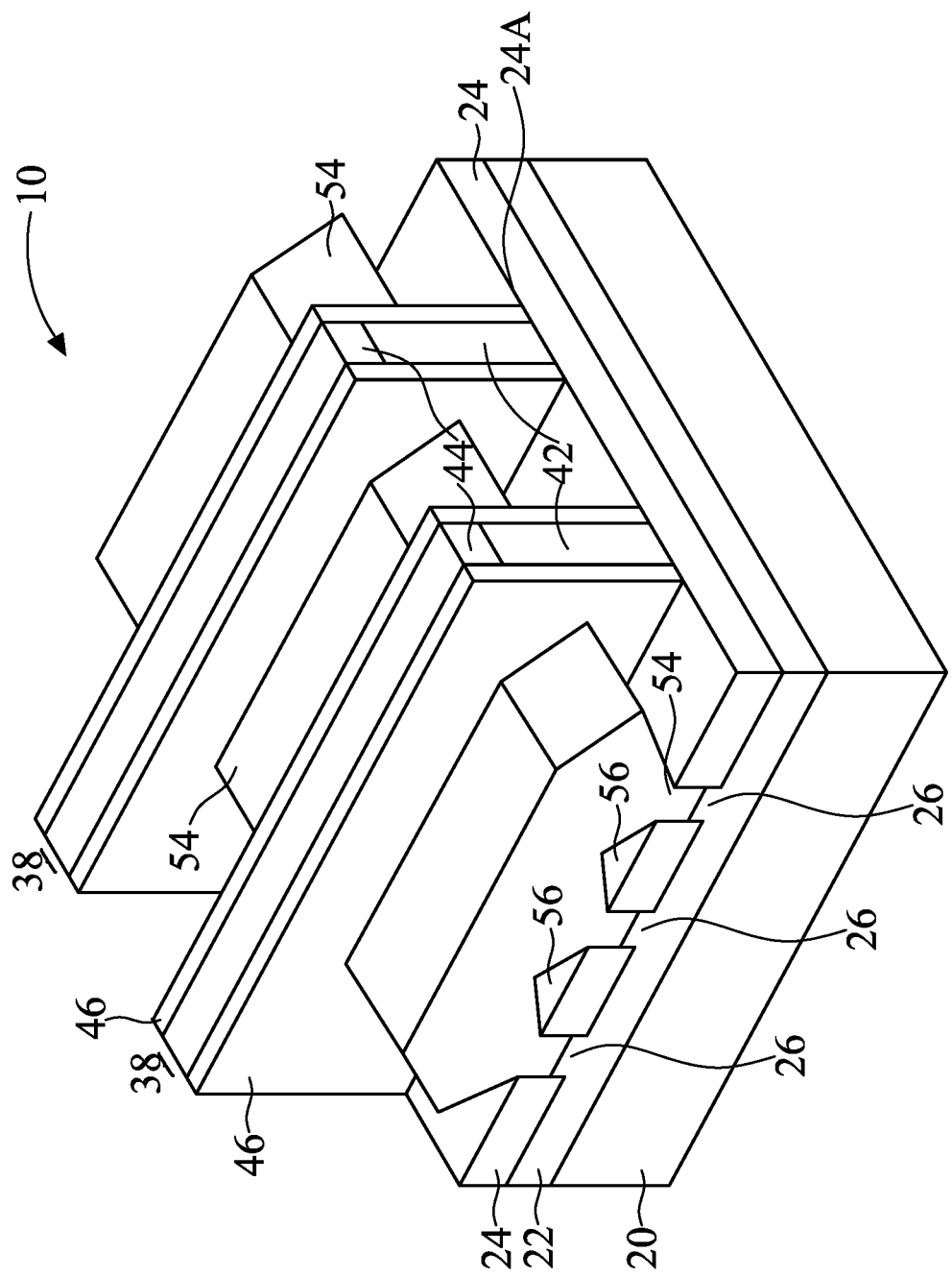

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 shown in FIG. 24. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
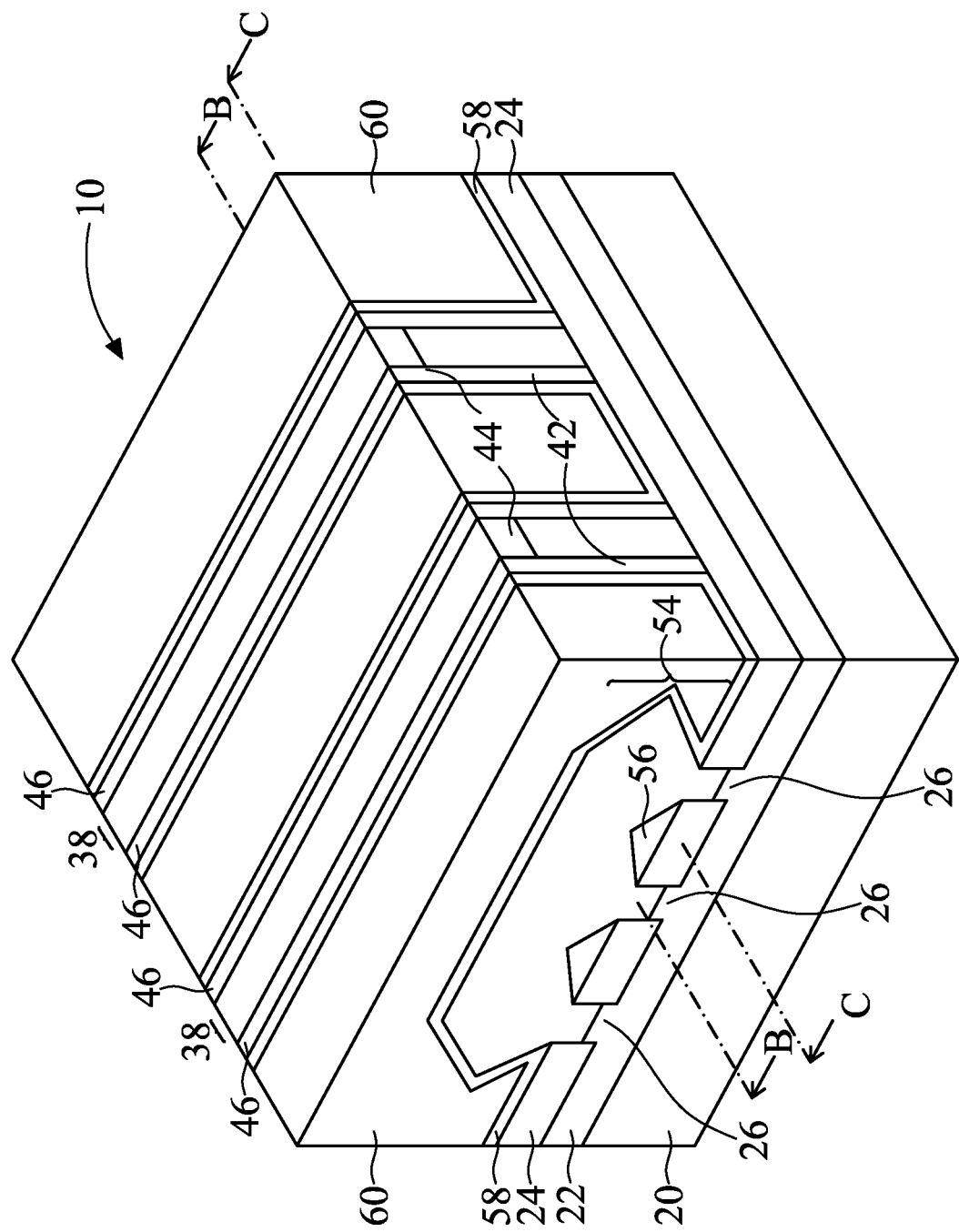
Figure 7C:
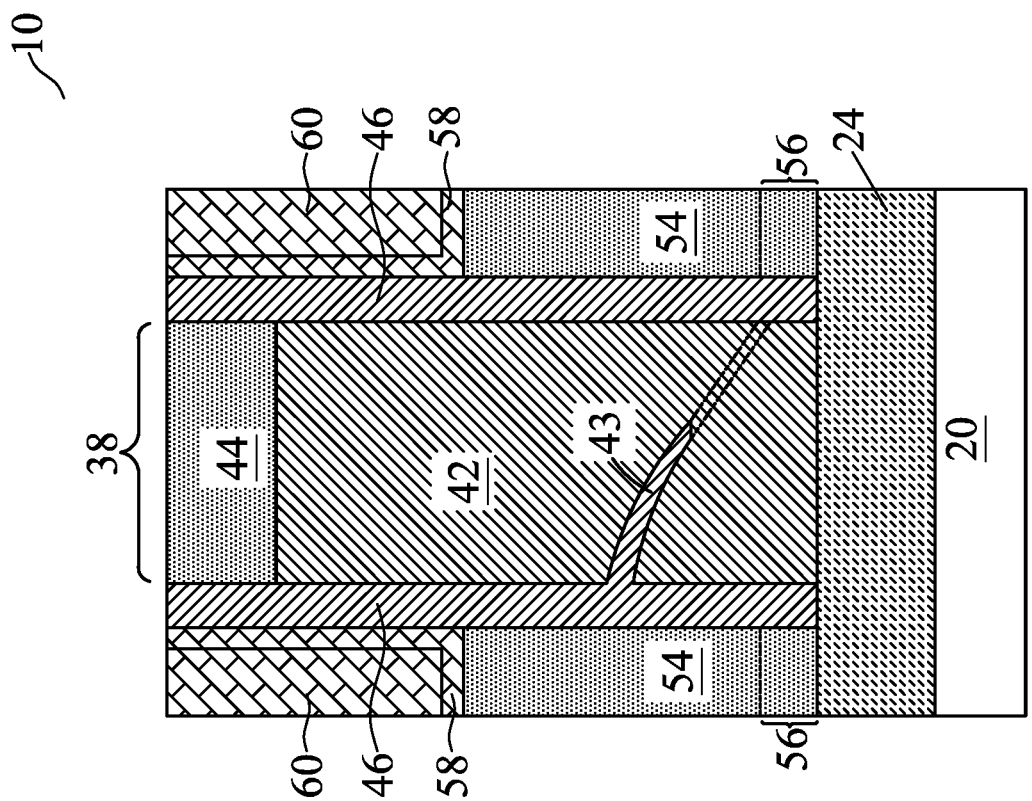

FIG. 7A illustrates a perspective view after the formation of Contact Etch Stop Layer (CESL) 58 and Inter-Layer Dielectric (ILD) 60. The respective process is illustrated as process 214 in the process flow 200 shown in FIG. 24. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
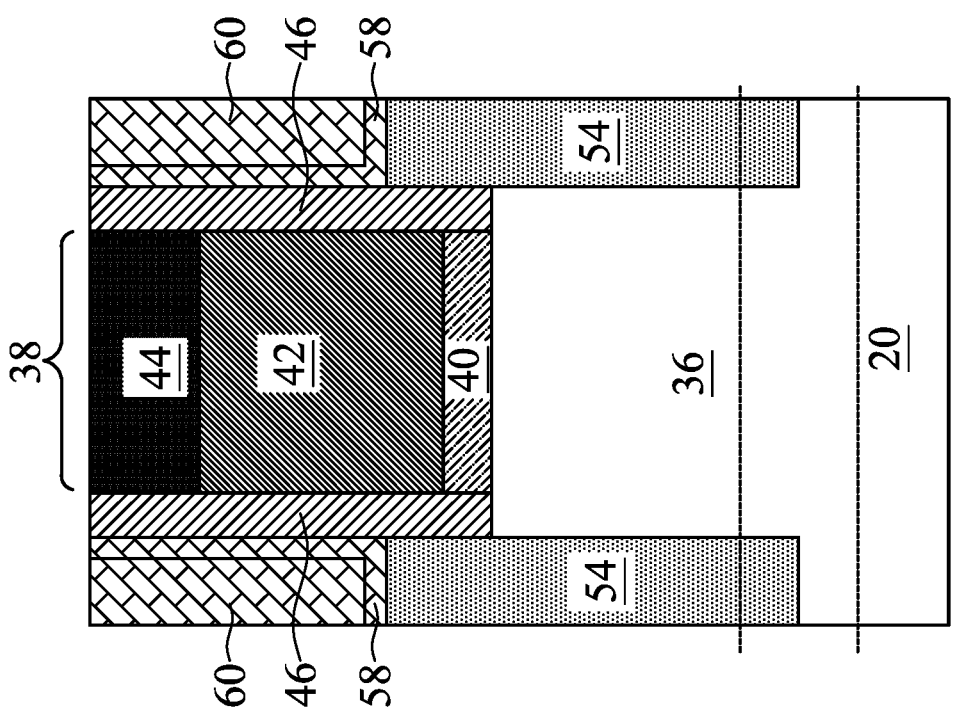

FIGS. 7B and 7C illustrate the cross-sectional views of the structure shown in FIG. 7A, wherein the cross-sectional views are obtained from the reference cross-section B-B and C-C, respectively, in FIG. 7A. The cross section of FIG. 7B passes through protruding fin 36, as can be perceived by comparing FIGS. 3 and 7A. The corresponding cross-section is referred to as an in-fin cross section hereinafter. The cross-section of FIG. 7C passes through STI region 24, as can also be perceived by comparing FIGS. 3 and 7A. The corresponding cross section is referred to as an out-of-fin cross section hereinafter. Air gaps 56 may (or may not) be formed, and the positions of air gaps 56 (if formed) are illustrated in FIG. 7C. As shown in FIG. 7C, spacer spike 43 extends into dummy gate electrode 42. Spacer spike 43 may extend to an intermediate position between the left edge and the right edge of dummy gate electrode 42. Spacer spike 43 may also extend from the left edge all the way to the right edge of dummy gate electrode 42, as illustrated by dashed lines. Spacer spike 43 may have the shape of thin filaments when viewed from the top view of the structure shown in FIG. 7A, or may have the shape of a thin vertical plate.

Figure 8A:
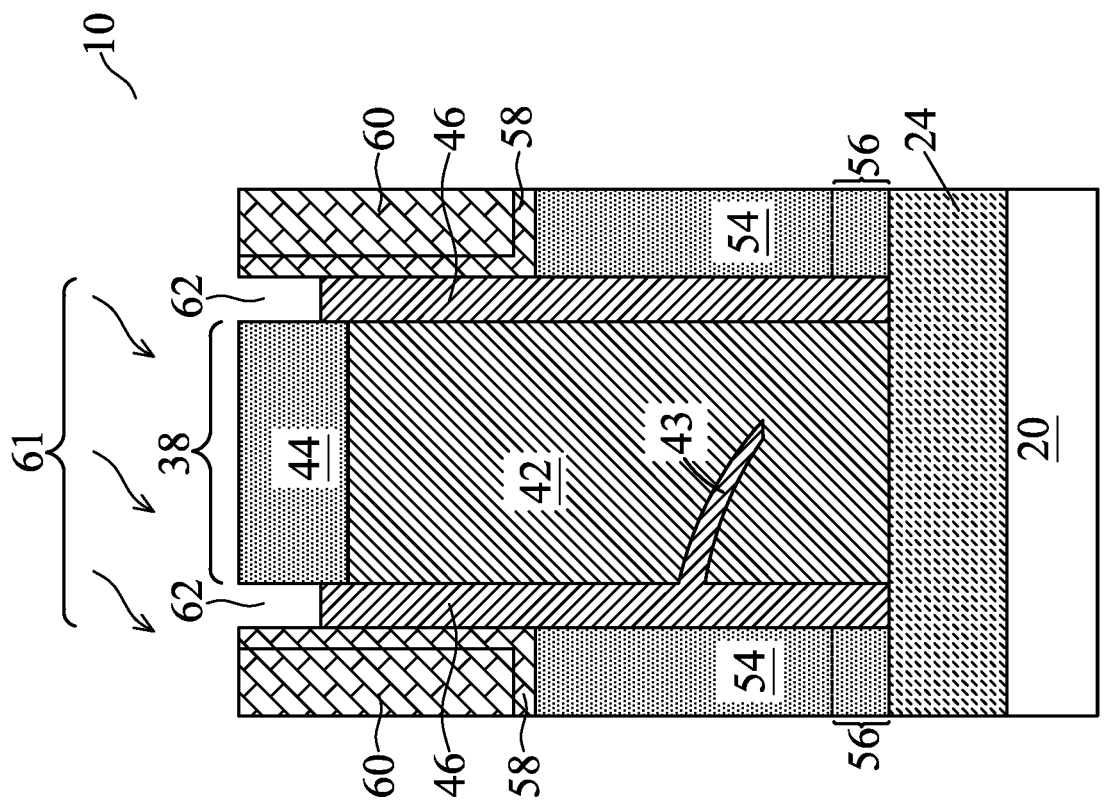
Figure 8B:
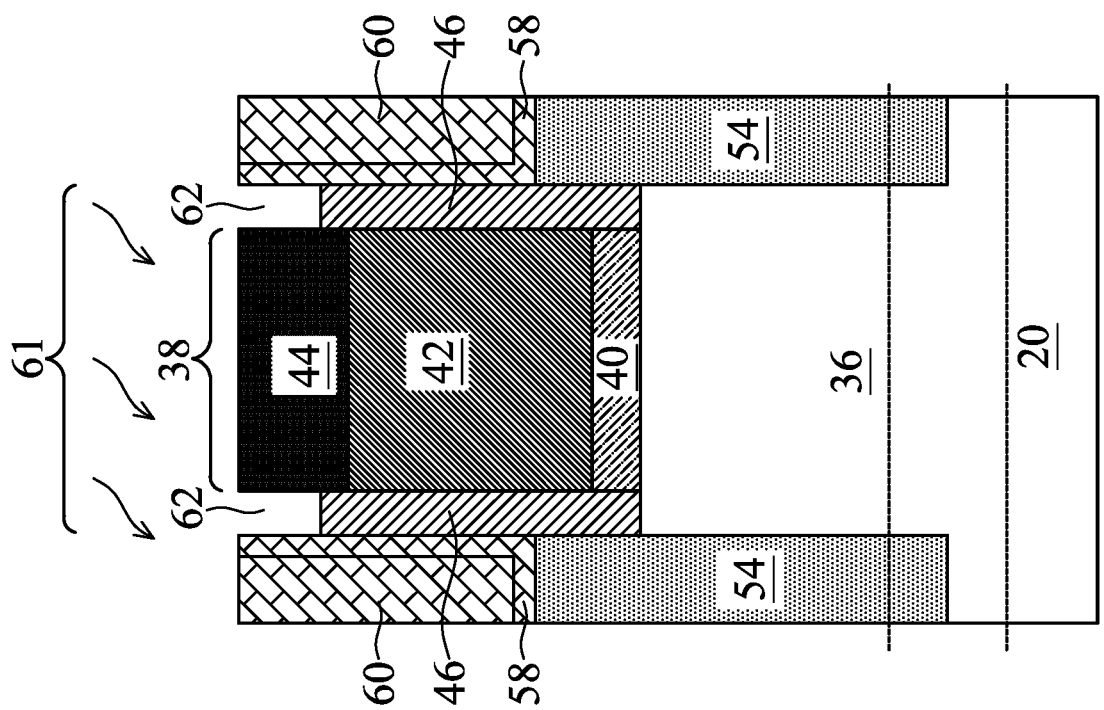

Referring to FIGS. 8A and 8B, which are obtained from the same planes as in FIGS. 7B and 7C, respectively, an etching process 61 is performed to recess the top portions of gate spacers 46, resulting in recesses 62. The respective process is illustrated as process 216 in the process flow 200 shown in FIG. 24. In accordance with some embodiments, gate spacers 46 form a ring encircling the corresponding dummy gate stack 38, and the corresponding recess 62 also forms a full ring. The bottom of recess 62 may be at a level between the top surface level and the bottom surface level of hard mask 44, or may be lower than the top surface level of dummy gate electrode 42.

The etching may be performed through dry etching or wet etching, and the corresponding etchant is selected based on the materials of gate spacers 46, hard masks 44, CESL 58, and ILD 60. In accordance with some embodiments, the dry etching is performed using direct plasma etching, remote plasma etching, radical etching, or the like. The etching gas may include a main etching gas and a passivation gas for adjusting etching selectivity, so that gate spacers 46 are etched, while hard masks 44, CESL 58, and ILD 60 are not etched. The main etching gas may include $Cl_2$, HBr, $CF_4$, $CHF_3$, $CH_2F_2$, $CH_3F$, $C_4F_6$, $BCl_3$, $SF_6$, $H_2$, or the like, or combinations thereof. The passivation gas may include $N_2$, $O_2$, $CO_2$, $SO_2$, CO, $SiCl_4$, or the like, or combinations thereof. Also, a dilute (carrier) gas such as Ar, He, Ne, or combinations thereof may be added. The pressure of the etching gas may be in the range between about 1 mTorr and about 800 mTorr. The flow rate of the etching gas may be in the range between about 1 sccm and about 5,000 sccm. The etching process may be performed with a plasma source power in the range between about 10 watts and about 3,000 watts, which source power is selected to control the ion-to-radical ratio in the plasma. A bias power may be, or may not be, applied, with the bias power being smaller than about 3,000 watts. The bias power may be used to control the plasma etch direction, with a higher bias power being used to achieve more anisotropic etching, and a lower (or no) bias power being applied to achieve more isotropic etching.

When the wet etching is performed, the respective chemical solution for the etching includes a main etching chemical for etching gate spacers 46 and an assisting etching chemical for adjusting the etching selectivity. The main etching chemical may include HF, $F_2$, or the like, or the combinations thereof. The assisting etching chemical may include $H_2SO_4$, HCl, HBr, $NH_3$, or combinations thereof. The solvent of the chemical solution includes de-ionized (DI) water, alcohol, acetone, or the like, or combinations thereof.

After the etching process 61, recess 62 is filled to form replacement gate spacers 64, as shown in FIGS. 9A and 9B. The respective process is illustrated as process 218 in the process flow 200 shown in FIG. 24. In the top view of the structure shown in FIGS. 9A and 9B, gate spacers 64 may be parts of a gate spacer ring that fully encircle dummy gate stack 38. The formation process of gate spacers 64 may include depositing a dielectric material, and then performing a planarization process such as a CMP process or a mechanical grinding process to remove excess portions of the dielectric material. The material of replacement gate spacers 64 is different from that of gate spacers 46 in order to have a desirable high etching selectivity from gate spacers 46 and spacer spikes 43, so that in subsequent process for removing spacer spikes 43, replacement gate spacers 64 may be used as an etching mask. The material of replacement gate spacers 64 may be selected from the same group of candidate materials for forming gate spacers 46, which may include SiN, SiON, SiOCN, SiC, SiOC, $SiO_2$, or the like. The material of replacement gate spacers 64 may also be selected from materials different from the candidate materials for forming gate spacers 46, and may be formed of a metal-based dielectric material such as HfO, TaN, or the like. Replacement gate spacers 64 may also be formed of the same elements (such as Si and O) as gate spacers 46, with the elements having different atomic percentages than that in gate spacers 46 to increase the etching selectivity. For example, when replacement gate spacers 64 and gate spacers 46 are both formed of silicon oxide, replacement gate spacers 64 may be more oxygen rich than gate spacers 46.

Figure 16:
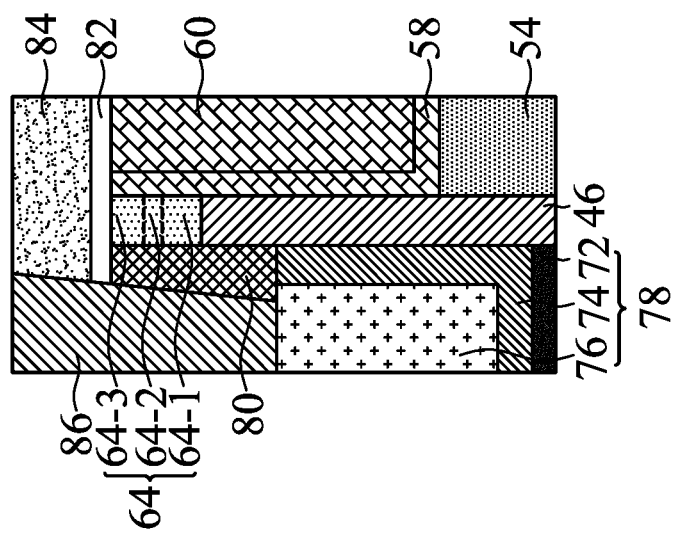

The height H1 of replacement gate spacers 64 may be in the range between about 5 Å and about 3,000 Å. Also, replacement gate spacers 64 may be single-layer spacers including a single layer, or may have a multi-layer structure including a plurality of layers, such as what is shown in FIG. 16. When formed of multiple layers, each sub layer may have a height in the range between about 3 Å and about 2,000 Å, or in the range between about 3 Å and about 500 Å. The height H2 of gate spacers 46 may be in the range between about 100 Å and about 3,000 Å. The width W1 of replacement gate spacers 64 may be in the range between about 3 Å and about 500 Å. Also, the bottoms of replacement gate spacers 64 may be higher than, level with, or lower than the top surface 36A of protruding fin 36, with dashed lines 37 illustrating the possible levels of the bottoms of replacement gate spacer 64. The bottoms of replacement gate spacers 64, on the other hand, are desirable to be higher than all spacer spikes 43. It is appreciated that when the bottoms of replacement gate spacers 64 are level with or lower than the top surface 36A of protruding fin 36, in the cross-section shown in FIG. 9A, the illustrated portions of gate spacers 46 will all be replaced with replacement gate spacers 64.

Hard masks 44, dummy gate electrodes 42, and spacer spikes 43 are then removed. Hard masks 44 are first removed in an etching process, which may be a dry etching process or a wet etching process. The etching chemical or gas is selected based on the material of hard masks 44. For example, when hard masks 44 are formed of silicon nitride, an etching gas including a fluorine-containing gas such as the mixture of $CF_4$, $O_2$, and $N_2$, the mixture of $NF_3$ and $O_2$, $SF_6$, the mixture of $SF_6$ and $O_2$, or the like, may be used.

Figure 10A:
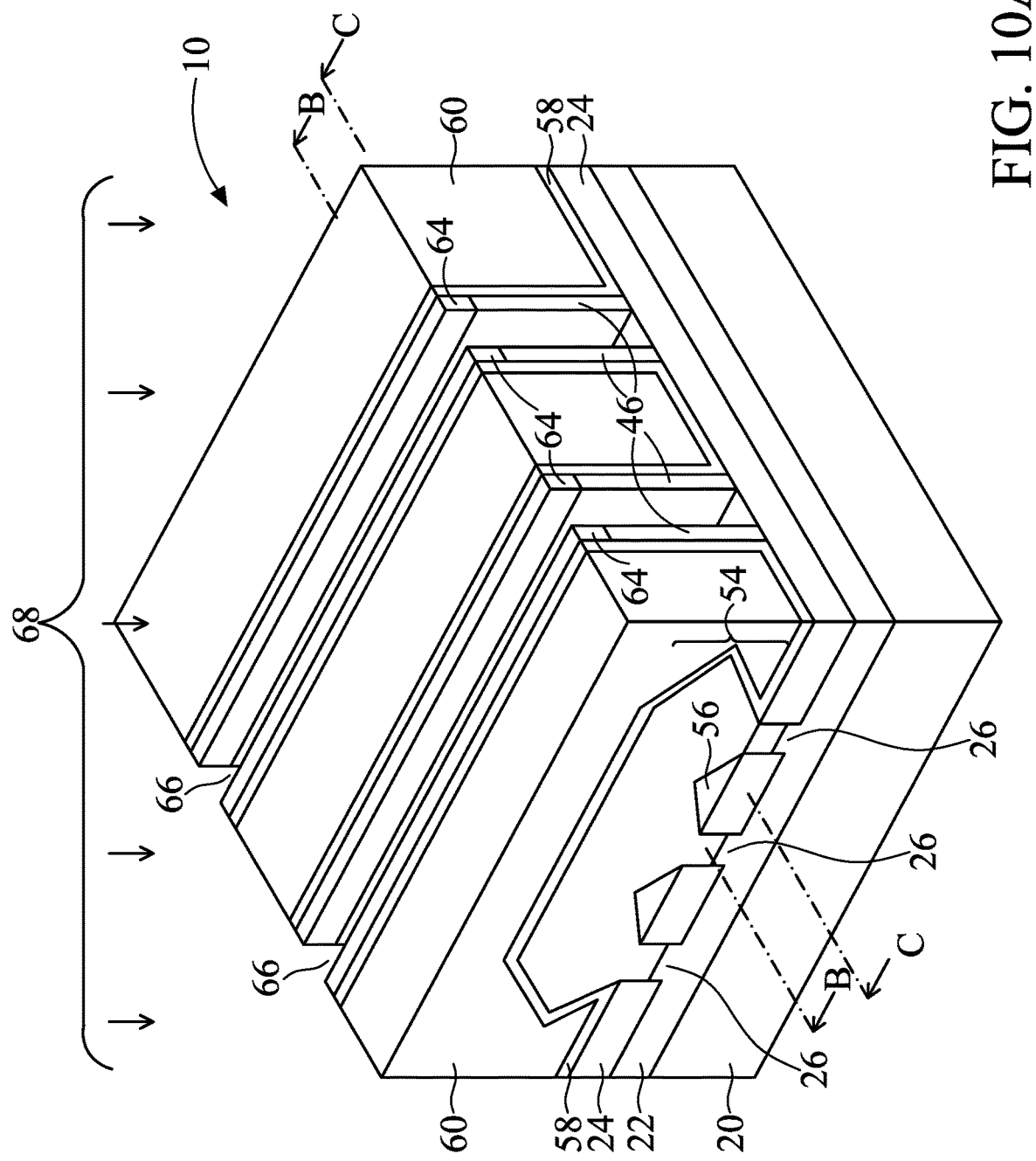
Figure 10C:
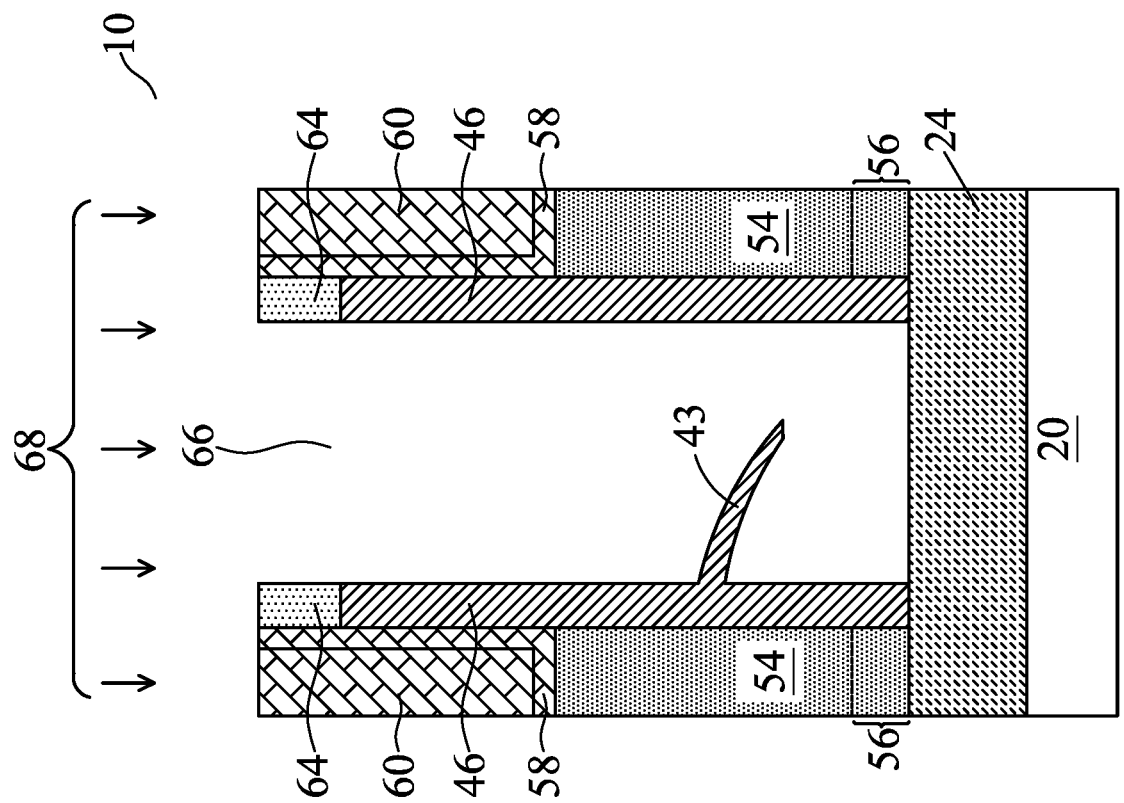
Figure 10B:
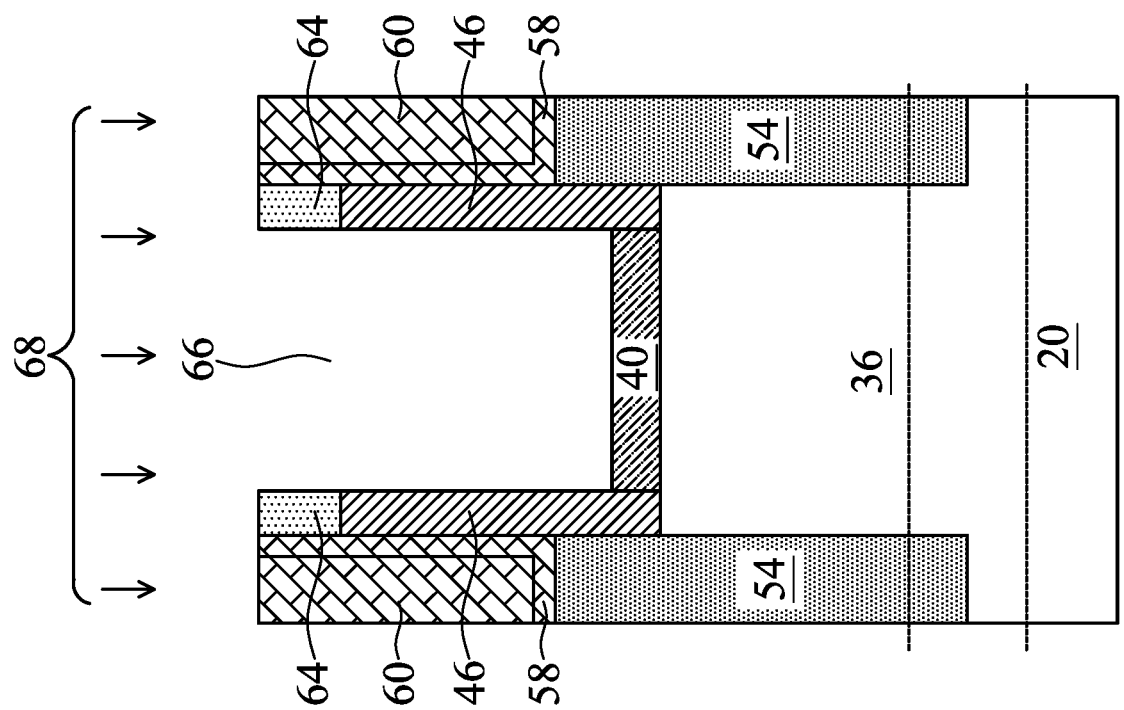

Dummy gate electrode 42 and spacer spikes 43 are then removed, with one of the example embodiments shown in FIGS. 10A, 10B, 10C, 11A, 11B, and 11C, while other etching processes may also be used, as will be discussed in subsequent paragraphs. The dummy gate electrode 42 as shown in FIGS. 9A and 9B are first removed, and the resulting structure and the etching process 68 are shown in FIGS. 10A, 10B, and 10C. Spacer spike 43 is thus exposed. The respective process is illustrated as process 220 in the process flow 200 shown in FIG. 24. FIGS. 10B and 10C illustrate the cross-sectional views of the structure shown in FIG. 10A, wherein the cross-sectional views are obtained from the reference cross-section B-B and C-C, respectively, in FIG. 10A.

Figure 11A:
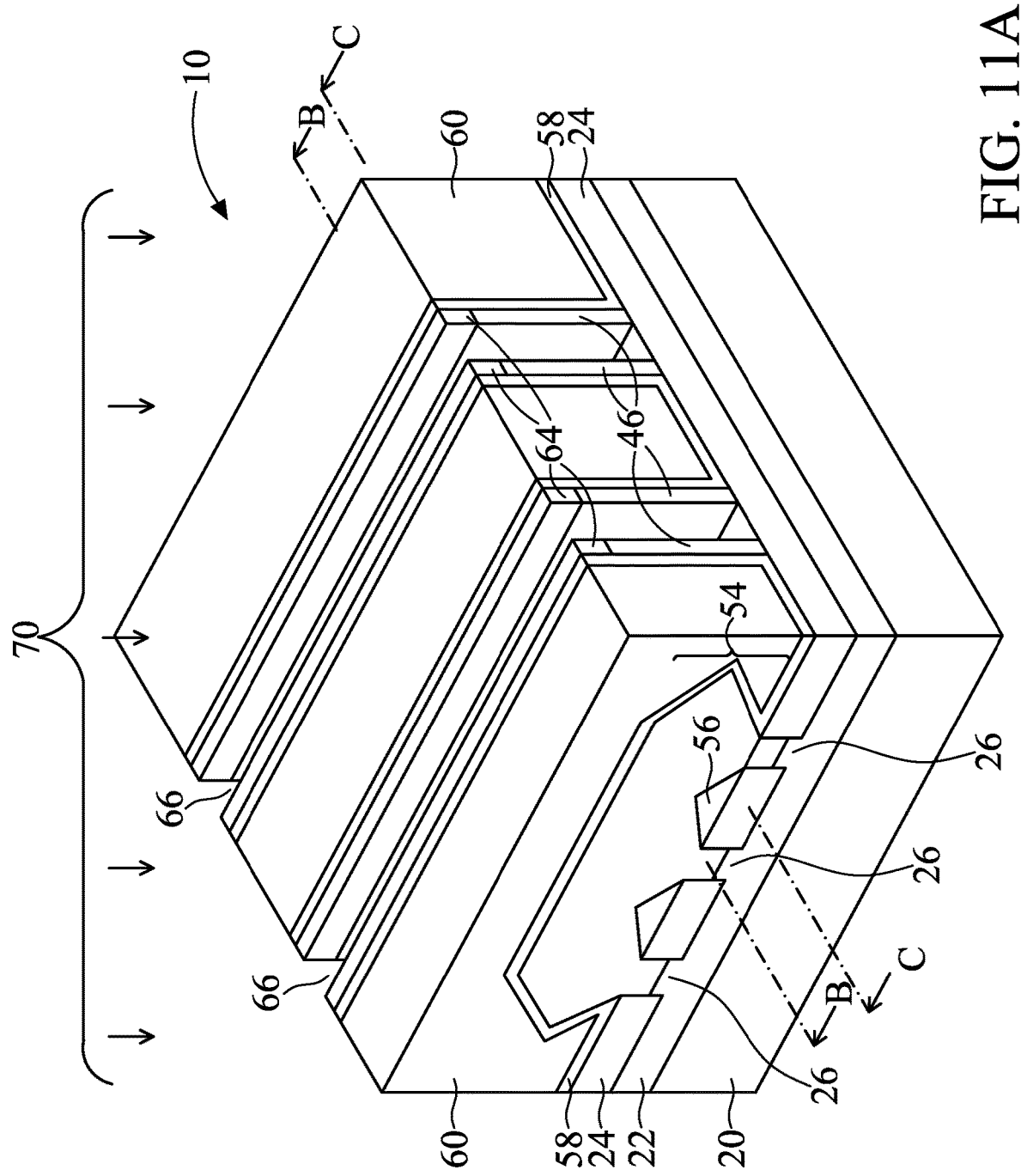
Figure 11C:
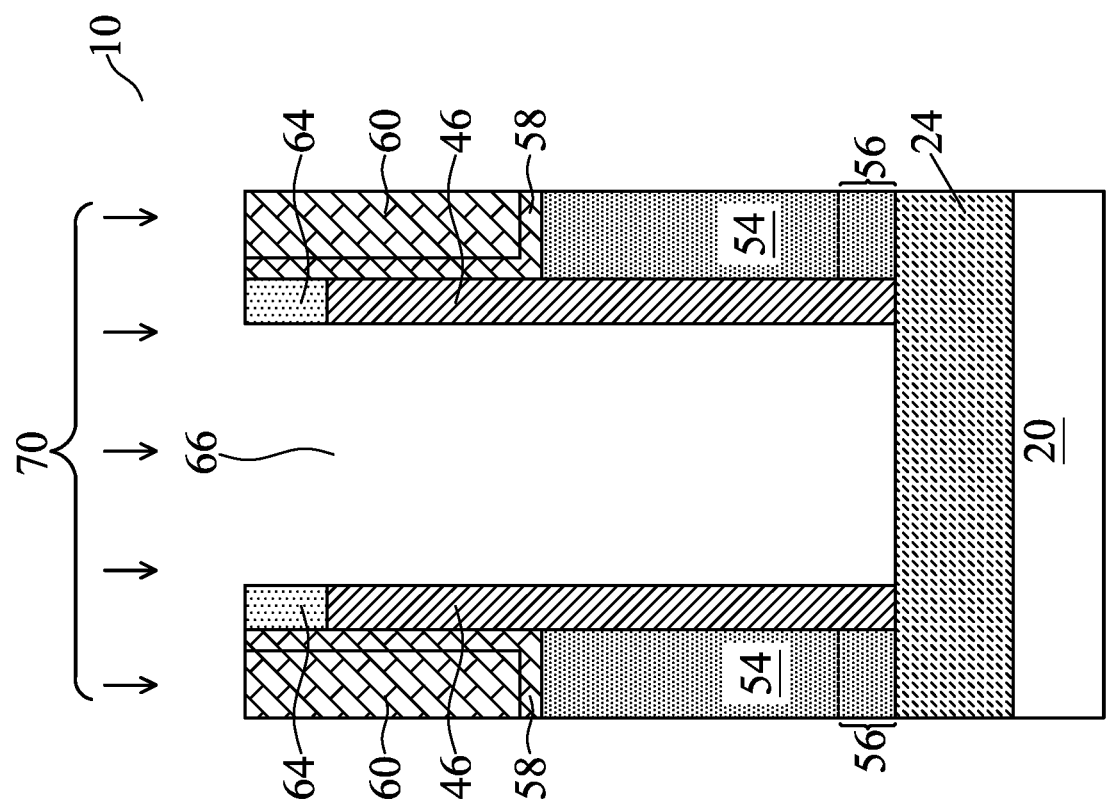
Figure 11B:
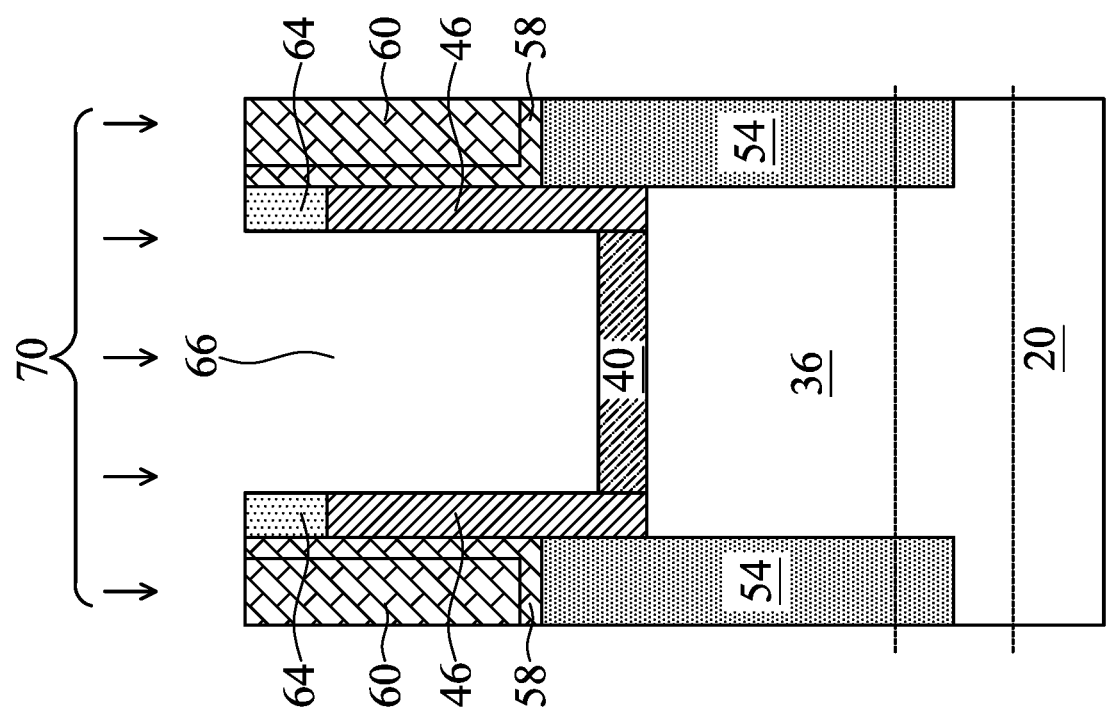

Next, spacer spike 43 is removed, and the resulting structure and the etching process 70 are shown in FIGS. 11A, 11B, and 11C. The respective process is illustrated as process 222 in the process flow 200 shown in FIG. 24. It is appreciated that the etching process 68 of dummy gate electrode 42 and the etching process 70 of spacer spike 43, while using different etching gases/chemicals, may be (or may not be) performed using etching gases/chemicals selected from the same group of candidate etching gases/chemicals, which are discussed in detail in subsequent paragraphs. Accordingly, the etching gases/chemicals for etching processes 68 and 70 are not discussed separately in subsequent paragraphs.

When dry etching is used for etching processes 68 and 70, the corresponding etching gas may include a main etching gas and a passivation gas for adjusting etching selectivity, so that the respective dummy gate electrode 42 and spacer spike 43 are etched, while replacement gate spacers 64, gate spacers 46, dummy gate dielectric 40, CESL 58, and ILD 60 are not etched. The main etching gas may include $Cl_2$, HBr, $CF_4$, $CHF_3$, $CH_2F_2$, $CH_3F$, $C_4F_6$, $BCl_3$, $SF_6$, $H_2$, or the like, or combinations thereof. The passivation gas may include $N_2$, $O_2$, $CO_2$, $SO_2$, CO, $SiCl_4$, or the like, or combinations thereof. Also, a dilute (carrier) gas such as Ar, He, Ne, or combinations thereof may be added. The pressure of the etching gas may be in the range between about 1 mTorr and about 800 mTorr. The flow rate of the etching gas may be in the range between about 1 sccm and about 5,000 sccm. The etching process may be performed with a plasma source power in the range between about 10 watts and about 3,000 watts, which source power is selected to control the ion-to-radical ratio in the plasma. A bias power may be, or may not be applied, with the bias power being smaller than about 3,000 watts. The bias power may be used to control the plasma etch direction, with a higher bias power being used to achieve more anisotropic etching, and a lower (or no) bias power being applied to achieve more isotropic etching. For example, when isotropic etching (such etching process 68) is used, the bias power may be smaller than about 20 watts, while when anisotropic etching (such etching process 70) is used, the bias power may be greater than about 50 watts.

When the wet etching is performed for etching process 68, the respective chemical solution includes a main etching chemical for etching dummy gate electrodes 42 and an assisting etching chemical for adjusting the etching selectivity. The main etching chemical may include HF, $F_2$, or the like, or the combinations thereof. The assisting etching chemical may include $H_2SO_4$, HCl, HBr, $NH_3$, or combinations thereof. The solvent of the chemical solution includes de-ionized (DI) water, alcohol, acetone, or the like, or combinations thereof. Etching process 70 is an anisotropic etching process, and hence is performed using dry etching, and wet etching is not used.

In accordance with some embodiments, the isotropic etching process 68 removes dummy gate electrode, hence forming trenches 66. The isotropic etching process 68 may be performed using dry etching or wet etching (as discussed in preceding paragraphs), and the corresponding etching chemical (gas or solution) may be selected from the aforementioned gases and chemical solutions, and selected depending on the materials, so that dummy gate electrode 42 is etched, while spacer spike 43, replacement gate spacers 64, gate spacers 46, dummy gate dielectric 40, CESL 58, and ILD 60 are not etched. For example, the etching selectivity of dummy gate electrode 42 to spacer spike 43, replacement gate spacers 64, gate spacers 46, dummy gate dielectric 40, CESL 58, and ILD 60 may be greater than 40, and may be in the range between about 10 and about 500. The reason of having a high etching selectivity of dummy gate electrode 42 to spacer spike 43 is that spacer spike 43 is formed of the same material as that of gate spacers 46, so that gate spacers 46 will not be damaged in isotropic etching process 68. After the etching process 68, spacer spike 43 may become a hanging spike.

FIGS. 11A, 11B, and 11C illustrate the anisotropic etching process 70 for removing spacer spike 43. Replacement gate spacers 64 are used as etching masks. Since etching process 70 is anisotropic, gate spacers 46, which are formed of a same material as that of spacer spike 43, is protected from the etching by replacement gate spacers 64. In accordance with some embodiments, the etching selectivity, which is the etching rate of spacer spike 43 to the etching rate of replacement gate spacers 64, may be greater than 5, and may be in the range between about 3 and about 100.

In above-discussed embodiments, an isotropic etching 68 and an anisotropic etching process 70 are performed to remove dummy gate electrode 42 and spacer spike 43. In accordance with alternative embodiments, a first isotropic etching process 68, which may be a dry etching process, is performed to remove a top portion of dummy gate electrode 42, wherein the depth of the etching is selected so that the spacer spike 43 is exposed after the first isotropic etching process. There may be, or may not be, some portions of dummy gate electrode 42 remaining underlying the exposed spacer spike 43. An anisotropic etching process 70 is then performed to remove spacer spike 43. After the anisotropic etching process 70, a second isotropic etching process, which may be a wet etching process, may be performed to remove the remaining dummy gate electrode 42 and any by-product polymer formed in the preceding dry etching processes.

In accordance with yet alternative embodiments, a dry isotropic etching process 68 is performed to fully remove dummy gate electrode 42, followed by a dry anisotropic etching process 70 to remove spacer spike 43. In accordance with these embodiments, at least one, or may be more, anisotropic etching process is used for removing spacer spike 43. For example, the etching may include a plurality of (such as 2, 3, 4, or more) cycles, each comprising an isotropic etching process to remove more of dummy gate electrode 42 and extend trench 66 deeper than the preceding cycle, followed by an anisotropic etching process to remove the spacer spike(s) 43 exposed in the preceding isotropic etching process.

Figure 12A:
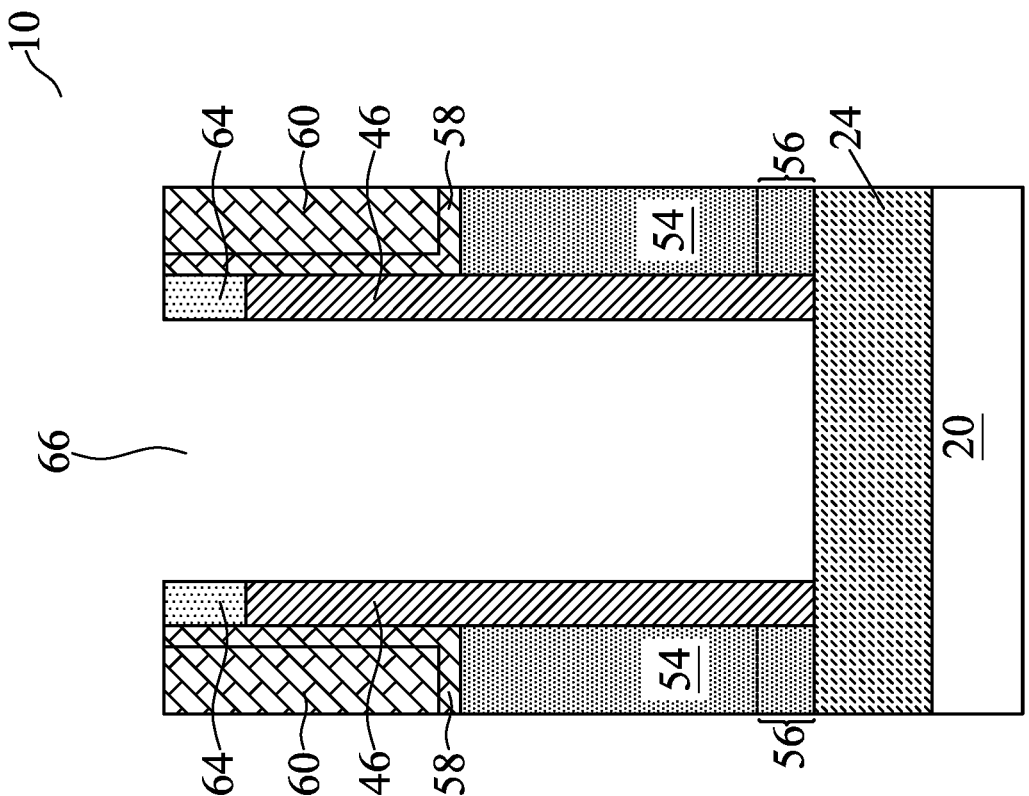
Figure 12B:
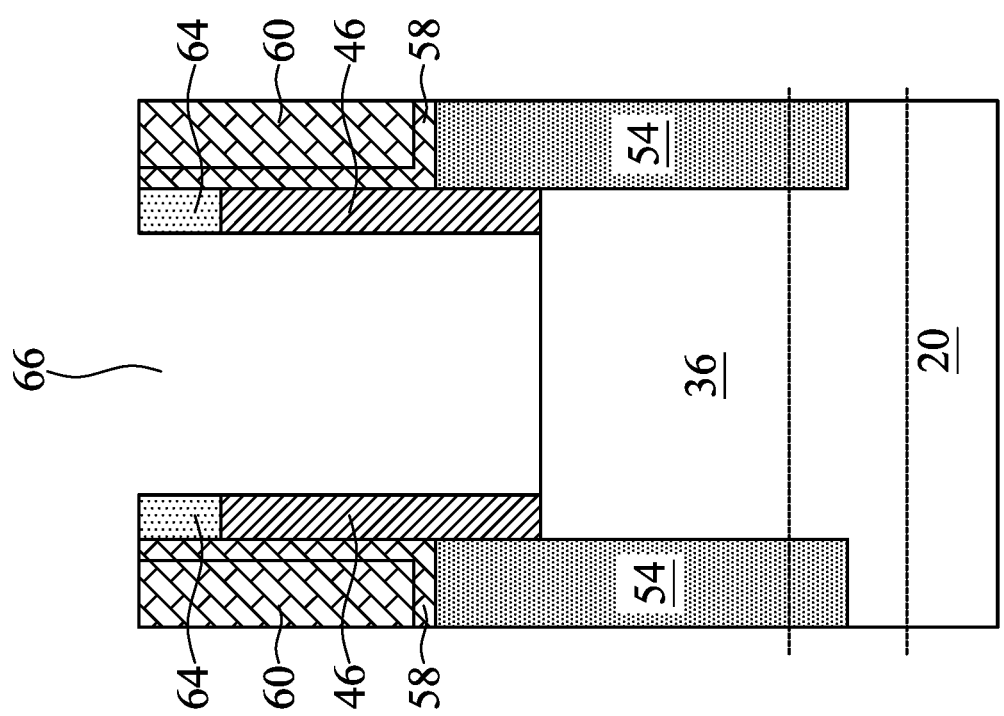

Next, dummy gate dielectric 40 is removed, and the resulting structure is shown in FIGS. 12A and 12B. The respective process is illustrated as process 224 in the process flow 200 shown in FIG. 24. Protruding fins 36 are thus exposed.

FIGS. 13A and 13B illustrate the formation of replacement gate stack 78, which includes Interfacial Layer (IL) 72, high-k dielectric layer 74, and gate electrode 76 in accordance with some embodiments. The respective process is illustrated as process 226 in the process flow 200 shown in FIG. 24. IL 72 may include an oxide layer such as a silicon oxide layer, which is formed through a thermal oxidation process or a chemical oxidation process to oxidize a surface layer of each of protruding fins 36. High-k dielectric layer 74 may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer. In accordance with some embodiments of the present disclosure, the high-k dielectric layer 74 is formed using ALD or CVD.

Gate electrode 76 is formed over high-k dielectric layer 74. Gate electrode 76 includes stacked conductive layers, which are not shown separately, while the stacked conductive layers may be distinguishable from each other. The deposition of the stacked conductive layers may be performed using a conformal deposition method(s) such as ALD or CVD. The stacked conductive layers may include an adhesion layer and one (or more) work-function layer over the adhesion layer. The adhesion layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer and a TiN layer over the TaN layer. After the deposition of the work-function layer(s), a barrier (glue) layer, which may be another TiN layer, is formed. The glue layer may or may not fully fill the trenches left by the removed dummy gate stacks. A filling conductive material such as tungsten, cobalt, or the like may be deposited to fully fill trench 66 if trench 66 has not been fully filled.

FIGS. 14A and 14B also illustrate the formation of (self-aligned) hard mask 80 in accordance with some embodiments. The respective process is illustrated as process 228 in the process flow 200 shown in FIG. 24. In accordance with other embodiments, hard mask 80 is not formed, and hence the top surfaces of replacement gate stack 78 and replacement gate spacer 64 are coplanar. The formation of hard mask 80 may include performing an etching process to recess gate stacks 78, so that a recess is formed between replacement gate spacers 64, filling the recesses with a dielectric material, and then performing a planarization process such as a CMP process or a mechanical grinding process to remove excess portions of the dielectric material. Hard mask 80 may be formed of silicon nitride, silicon oxynitride, silicon oxy-carbo-nitride, or the like. Next, dielectric etch stop layer 82, dielectric layer 84, and gate contact plug 86 are formed.

Figure 15:
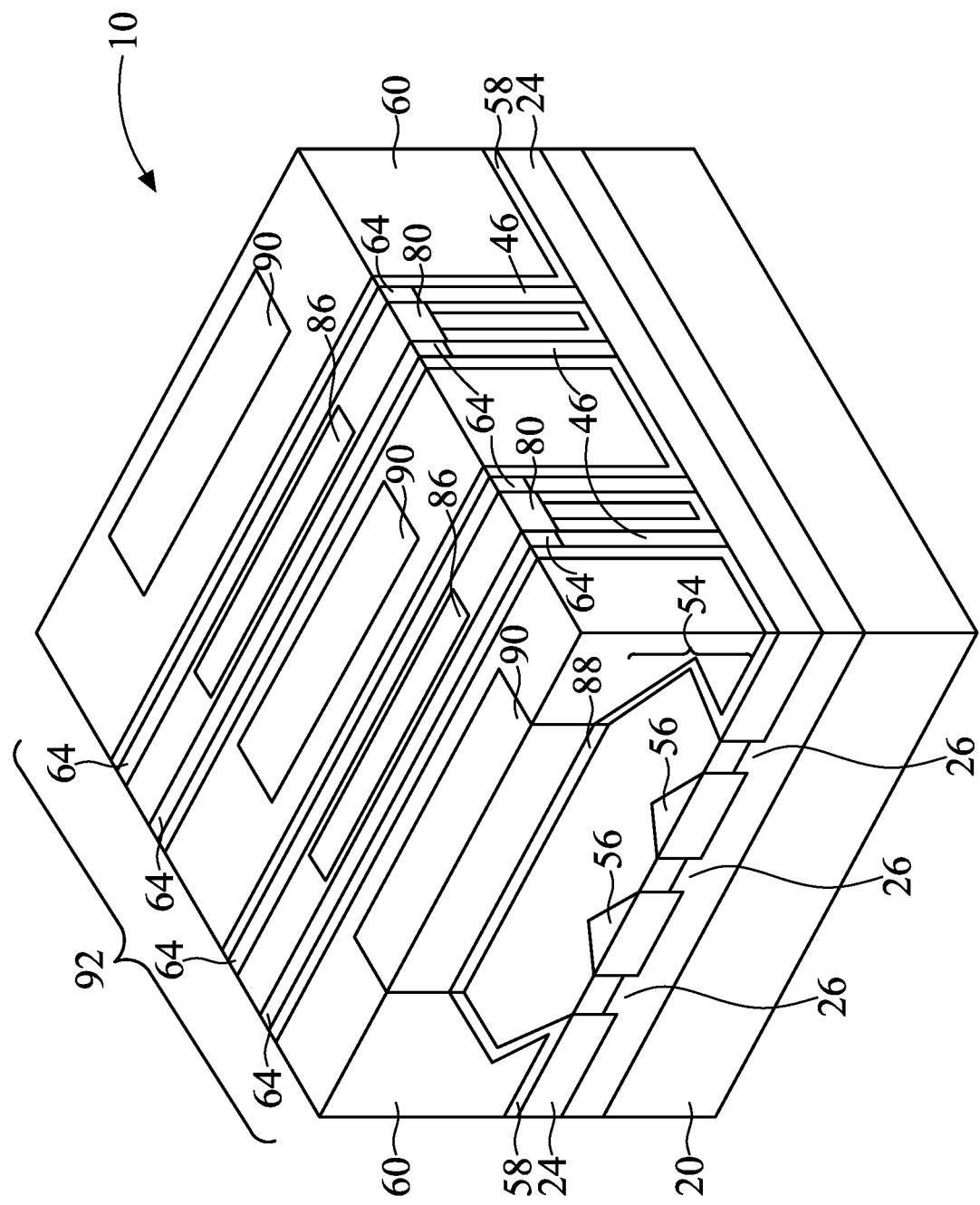

FIG. 15 illustrates a perspective view in the formation of additional features including source/drain silicide regions 88 and source/drain contact plugs 90. Hard masks 80 and gate contact plugs 86 are also formed. The respective process is illustrated as process 230 in the process flow 200 shown in FIG. 24. Transistor 92 is thus formed.

FIGS. 16 through 23 illustrate some details of the replacement gate spacers 64 in accordance with some embodiments. FIGS. 16 through 23 illustrate the details in region 91 in FIG. 14A in accordance with some embodiments. It is appreciated that different embodiments in these figures may be combined into the same transistor in any combination when applicable. For example, the multi-layer replacement gate spacer 64 shown in FIG. 16 may be combined with the multi-layer gate spacers 46 shown in FIG. 17, and the replacement gate spacer 64 may be narrower (FIG. 18) or wider (FIG. 19) than the underlying gate spacers 46. Also, the interface between replacement gate spacer 64 and gate spacers 46 may be higher than (as illustrated), level with, or lower than the interface between gate stack 78 and hard mask 80 in each of the illustrated embodiments.

Referring to FIG. 16, replacement gate spacer 64 includes a plurality of sub layers 64-1, 64-2, and 64-3, with neighboring sub layers being formed of different materials and/or having different compositions (different atomic percentages of the elements). In accordance with some embodiments, the top sub layer (such as layer 64-3) may have a high (and possibly highest) etching selectivity to gate spacer 46, so that in the removal of spacer spike 43 as in the step shown in FIG. 11C, the top sub layer may act as an effective etching mask. Adopting different materials for the sub layers provides the ability for balancing different requirements, such as the requirement of adjusting Cgc (gate-to-channel capacitance), the ability of reducing leakage between gate and source/drain, and the ability of acting as the etching mask. For example, the lower sub layers may be selected to have higher leakage-prevention ability than upper layers, while the upper layers may be better etching masks (for the etching of spacer spike 43) than the lower layers. The total number of sub layers in replacement gate spacer 64 may be any number smaller than 10.

Figure 17:
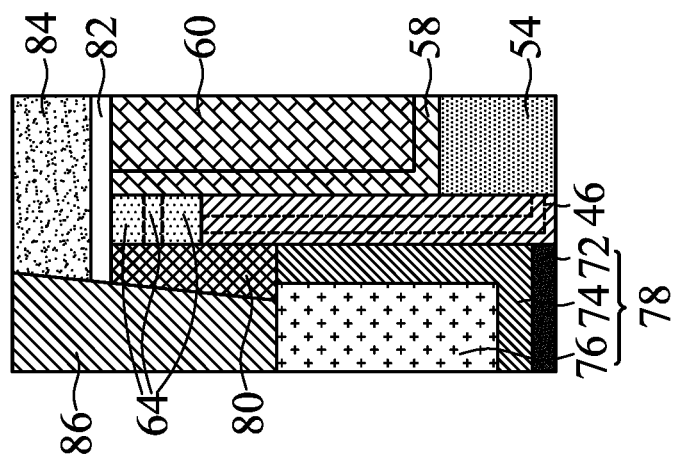
FIG. 16 through 23 illustrate replacement gate spacers in accordance with some embodiments.

FIG. 17 illustrates an embodiment in which gate spacer 46 includes multiple layers formed of different materials. The total number of sub layers in gate spacer 46 may be 2, 3, or more.

Figure 18:
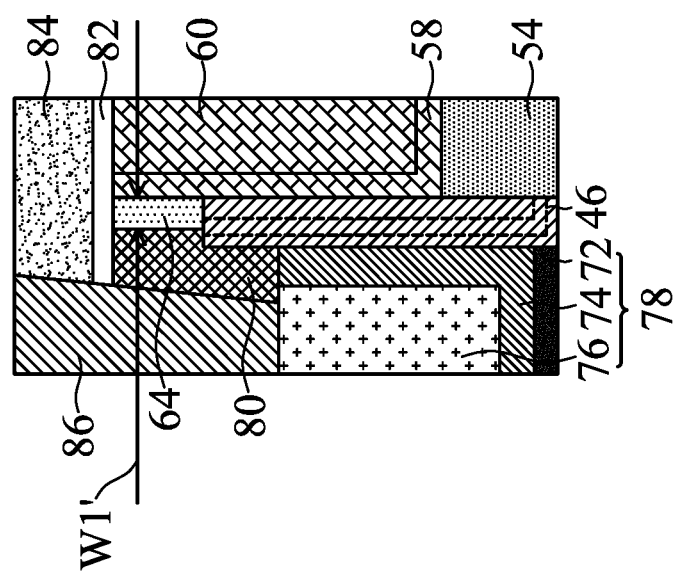

FIG. 18 illustrates the width Wr of replacement gate spacer 64 being smaller than the width W2 of gate spacer 46. This may be caused by the step of removing the dummy gate stack, during which the isotropic etching process 68 (FIGS. 10B and 10C) laterally etches replacement gate spacer 64 more than gate spacer 46. In accordance with some embodiments, ratio W1'/W2 is smaller than about 0.8, or may be smaller than about 0.5. Width Wr is also smaller than the width W1 (FIG. 9B) of replacement gate spacer 64.

Figure 19:
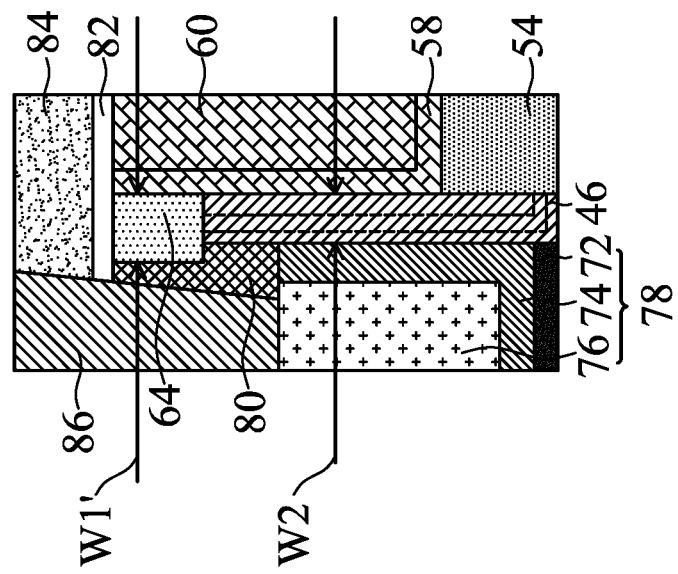

FIG. 19 illustrates the width W1' of replacement gate spacer 64 being greater than the width W2 of gate spacer 46. This may be caused by the step of removing the dummy gate stack, during which the etching process 68 (FIGS. 10B and 10C) laterally etches replacement gate spacer 64 less than gate spacer 46. In accordance with some embodiments, ratio W2/W1' is smaller than about 0.8, or may be smaller than about 0.5.

Figure 20:
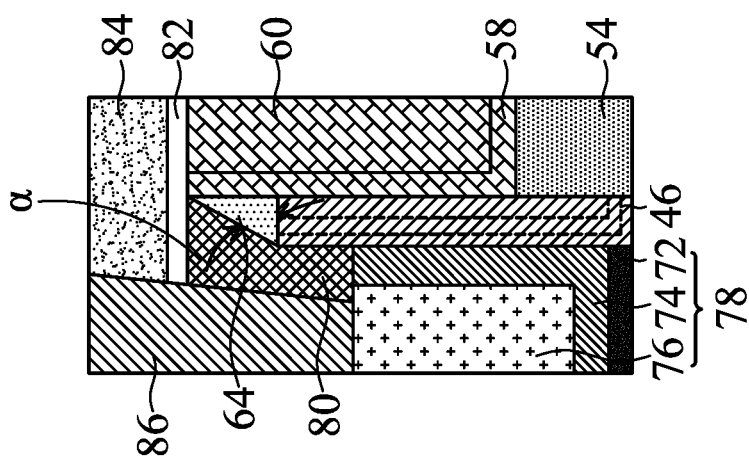

FIG. 20 illustrates that the upper portions of replacement gate spacer 64 are increasingly narrower than the respective lower portions. This may be caused by the step of removing the dummy gate stack, during which replacement gate spacer 64 is damaged (etched). The cross-sectional view of replacement gate spacer 64 may have a triangular shape in accordance with some embodiments. In accordance with some embodiments, the angle α of the slant edge is in the range between about 30 degrees and about 85 degrees.

Figure 21:
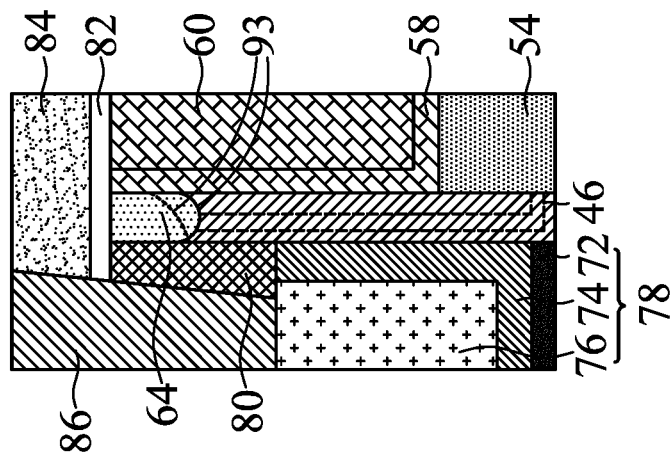
Figure 23:
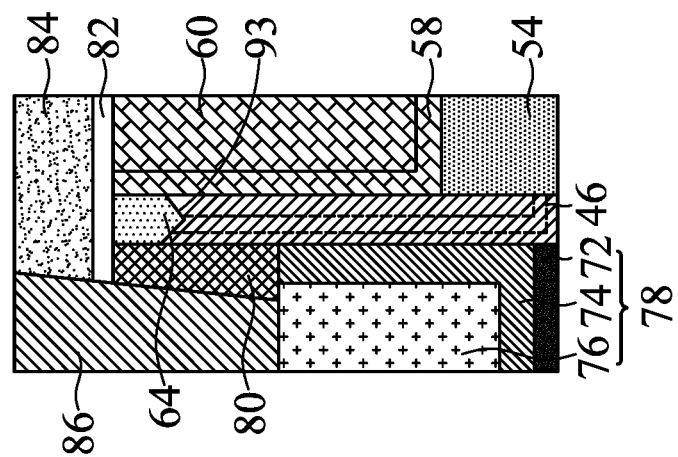
Figure 22:
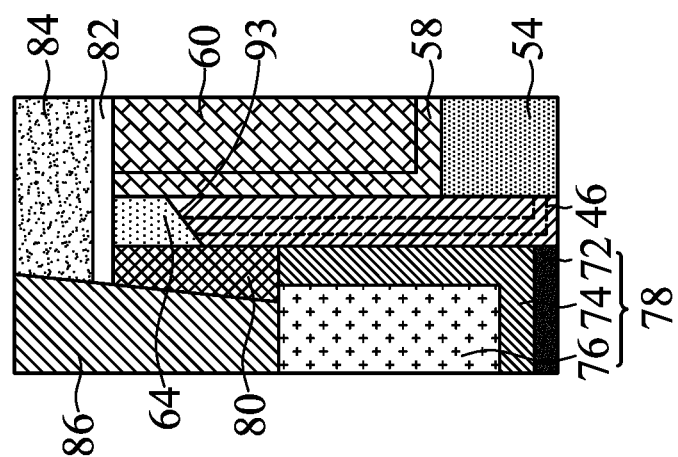

FIGS. 21, 22, and 23 illustrate different interfaces 93 between replacement gate spacer 64 and gate spacer 46. These interfaces may be caused by the recessing of gate spacer 46, so that the corresponding top surfaces of gate spacer 46 have different shapes. The interfaces with different shapes may be related to the material of gate spacer 46, the etching chemical, and the like. FIG. 21 illustrates the interface 93 that is curved, with the solid line representing the interface 93 being symmetric, and the dashed line representing the interface 93 that is asymmetric. FIG. 22 illustrates that the interface 93 is straight and slanted. FIG. 23 illustrates that the interface 93 has a V-shape.

The embodiments of the present disclosure have some advantageous features. By replacing the top portion of gate spacers with replacement gate spacers having different materials than the underlying portions of the original gate spacers, the replacement gate spacers may act as an etching mask for the removal of spacer spikes, so that an anisotropic etching process may be performed to remove the spacer spikes without damaging the underlying portions of the original gate spacers.

In accordance with some embodiments of the present disclosure, a method includes forming a dummy gate electrode on a semiconductor region; forming a first gate spacer on a sidewall of the dummy gate electrode; removing an upper portion of the first gate spacer to form a recess, wherein a lower portion of the first gate spacer remains; filling the recess with a second gate spacer; removing the dummy gate electrode to form a trench; and forming a replacement gate stack in the trench. In an embodiment, the first gate spacer is formed of a first material, and the second gate spacer is formed of a second material different from the first material. In an embodiment, the forming the first gate spacer results in a spacer spike being formed extending into the dummy gate electrode, and the method further comprises performing a first etching process to remove at least a portion of the dummy gate electrode, with the spacer spike being exposed; and performing a second etching process to remove the spacer spike. In an embodiment, the first etching process is isotropic, and the second etching process is anisotropic. In an embodiment, the second etching process is performed using the second gate spacer as an etching mask, and wherein the first gate spacer has a higher etching rate in response to an etching chemical used for the second etching process than the second gate spacer. In an embodiment, the method further includes depositing a CESL, wherein the dummy gate electrode and the CESL are on opposite sides of, and contacting, the first gate spacer and the second gate spacer. In an embodiment, the semiconductor region comprises a semiconductor fin, and wherein the recess has a bottom surface higher than a top surface of the semiconductor fin. In an embodiment, the semiconductor region comprises a semiconductor fin, and wherein the recess has a bottom surface lower than a top surface of the semiconductor fin.

In accordance with some embodiments of the present disclosure, a device includes a semiconductor region; a gate stack over the semiconductor region; a first gate spacer on a sidewall of the gate stack; a second gate spacer overlapping at least a portion of the first gate spacer, wherein the first gate spacer and the second gate spacer are formed of different materials; and a contacting etch stop layer contacting sidewalls of both of the first gate spacer and the second gate spacer. In an embodiment, the device further includes a dielectric layer, wherein both of a first top surface of the contact etch stop layer and a second top surface of the second gate spacer are in contact with a bottom surface of the dielectric layer. In an embodiment, a first edge of the first gate spacer is substantially flush with a second edge of the second gate spacer. In an embodiment, the first gate spacer extends laterally beyond the second gate spacer. In an embodiment, the second gate spacer extends laterally beyond the first gate spacer. In an embodiment, the semiconductor region comprises a semiconductor fin, and wherein an interface between the first gate spacer and the second gate spacer is at a level higher than a top surface of the semiconductor fin. In an embodiment, the semiconductor region comprises a semiconductor fin, and wherein an interface between the first gate spacer and the second gate spacer is level with a top surface of the semiconductor fin. In an embodiment, the second gate spacer comprises a plurality of sub layers, with upper ones of the plurality of sub layers overlapping respective lower ones of the plurality of sub layers.

In accordance with some embodiments of the present disclosure, a device includes a semiconductor fin; a gate stack on a top surface and sidewalls of the semiconductor fin; a dielectric hard mask over the gate stack; a first gate spacer comprising a first sidewall contacting a second sidewall of the gate stack; a second gate spacer over the first gate spacer, wherein the second gate spacer comprises a third sidewall contacting a fourth sidewall of the dielectric hard mask, and wherein the second gate spacer and the first gate spacer form a distinguishable interface; a source/drain region on a side of the gate stack; and a contact etch stop layer comprising a portion over the source/drain region, wherein the contact etch stop layer is on an opposing side of the first gate spacer and the second gate spacer than the gate stack and the dielectric hard mask. In an embodiment, the gate stack has a topmost surface, and wherein an entirety of the second gate spacer is higher than the topmost surface. In an embodiment, at least a portion of the second gate spacer is higher than an entirety of the first gate spacer. In an embodiment, the first sidewall is flush with the third sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a dummy gate stack on a semiconductor region;
   forming a first gate spacer on a sidewall of the dummy gate stack;

forming a contact etch stop layer, wherein the first gate spacer and the contact etch stop layer contact each other to form an interface;

removing an upper portion of the first gate spacer to form a recess between the dummy gate stack and the contact etch stop layer, wherein the recess extends downwardly from a top edge of the contact etch stop layer toward the semiconductor region, and wherein a lower portion of the first gate spacer remains;

filling the recess with a second gate spacer;

removing the dummy gate stack to form a trench; and forming a replacement gate stack in the trench.

2. The method of claim 1, wherein the first gate spacer is formed of a first material, and the second gate spacer is formed of a second material different from the first material.

3. The method of claim 1, wherein the forming the first gate spacer results in a spacer spike being formed extending into the dummy gate stack, and the method further comprises:

performing a first etching process to remove at least a portion of the dummy gate stack, with the spacer spike being exposed; and performing a second etching process to remove the spacer spike.

4. The method of claim 3, wherein the first etching process is isotropic, and the second etching process is anisotropic.

5. The method of claim 3, wherein the second etching process is performed using the second gate spacer as an etching mask, and wherein the first gate spacer has a higher etching rate in response to an etching chemical used for the second etching process than the second gate spacer.

6. The method of claim 1, wherein the upper portion of the first gate spacer comprises a first sidewall contacting the dummy gate stack, and a second sidewall contacting the contact etch stop layer, and the first sidewall and the second sidewall are parallel to each other.

7. The method of claim 1, wherein the semiconductor region comprises a semiconductor fin, and wherein the recess has a bottom surface higher than a top surface of the semiconductor fin.

8. The method of claim 1, wherein the semiconductor region comprises a semiconductor fin, and wherein the recess has a bottom surface lower than a top surface of the semiconductor fin.

9. A method comprising:

forming a source/drain region extending into a semiconductor region;

forming a gate stack over the semiconductor region;

forming a contact etch stop layer comprising:
a horizontal portion overlapping the source/drain region; and
a vertical portion joined to the horizontal portion; and forming a gate spacer between, and contacting both of, the gate stack and the vertical portion of the contact etch stop layer, wherein the forming the gate spacer comprises:
forming a first portion using a first dielectric material; and
forming a second portion overlapping the first portion, wherein the second portion is formed using a second dielectric material different from the first dielectric material, and wherein at a time the second portion is being formed, the second dielectric material comprises:
a first sidewall contacting the gate stack to form a first vertical interface; and
a second sidewall contacting the contact etch stop layer to form a second vertical interface, and wherein the first sidewall and the second sidewall are opposite sidewalls of the second portion.

10. The method of claim 9 further comprising depositing a dielectric layer over and in physical contact with both of a first top surface of the contact etch stop layer and a second top surface of the second portion of the gate spacer.

11. The method of claim 9, wherein a first edge of the second portion of the gate spacer is formed as being substantially flush with a second edge of the first portion of the gate spacer.

12. The method of claim 11, wherein a third edge of the second portion of the gate spacer is formed as being substantially flush with a fourth edge of the first portion of the gate spacer, and wherein the first edge and the third edge are opposing edges of the second portion of the gate spacer.

13. The method of claim 9, wherein the forming the second portion of the gate spacer comprises:

after the gate stack and the contact etch stop layer are formed, recessing the first portion of the gate spacer to form a recess; and filling the second dielectric material into the recess.

14. The method of claim 13, wherein the recess is wider than the first portion of the gate spacer.

15. The method of claim 13, wherein the recess is narrower than the first portion of the gate spacer.

16. The method of claim 9, wherein the semiconductor region comprises a semiconductor fin, and wherein both of the gate spacer and the gate stack extend on a top surface and sidewalls of the semiconductor fin.

17. The method of claim 9, wherein the first portion of the gate spacer comprises a plurality of sub layers, with upper ones of the plurality of sub layers overlapping respective lower ones of the plurality of sub layers.

18. A method comprising:

forming a gate stack on a top surface and sidewalls of a semiconductor fin;

forming a dielectric hard mask over the gate stack;

forming a source/drain region on a side of the gate stack; and forming a first gate spacer comprising:
a first sidewall physically contacting a second sidewall of the gate stack; and
a third sidewall physically contacting a fourth sidewall of the source/drain region;

forming a second gate spacer over the first gate spacer, wherein the first gate spacer and the second gate spacer comprise different dielectric materials, and wherein the second gate spacer comprises:
a fifth sidewall contacting the dielectric hard mask; and
a sixth sidewall flush with the fourth sidewall of the source/drain region.

19. The method of claim 18 further comprising:

after the forming the first gate spacer and before the forming the second gate spacer, forming a contact etch stop layer comprising a portion over the source/drain region, wherein the contact etch stop layer is on an opposing side of the first gate spacer and the second gate spacer than the gate stack and the dielectric hard mask.

20. The method of claim 19, wherein the forming the second gate spacer comprises, recessing the first gate spacer to form a recess, wherein edges of both of the contact etch stop layer and the dielectric hard mask are exposed to the recess.

* * * * *